United States Patent
Uebayashi et al.

(10) Patent No.: US 11,647,677 B2
(45) Date of Patent: May 9, 2023

(54) PIEZOELECTRIC CERAMICS, PIEZOELECTRIC ELEMENT, AND ELECTRONIC APPARATUS

(71) Applicant: CANON KABUSHIKI KAISHA, Tokyo (JP)

(72) Inventors: Akira Uebayashi, Tokyo (JP); Kanako Oshima, Tokyo (JP); Makoto Kubota, Yokohama (JP); Tatsuo Furuta, Machida (JP); Yasushi Shimizu, Fujisawa (JP); Mikio Shimada, Tokyo (JP); Chiaki Arii, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 882 days.

(21) Appl. No.: 16/425,139

(22) Filed: May 29, 2019

(65) Prior Publication Data
US 2019/0378970 A1    Dec. 12, 2019

(30) Foreign Application Priority Data

Jun. 8, 2018   (JP) .............................. JP2018-110570

(51) Int. Cl.
*H01L 41/18*     (2006.01)
*H01L 41/187*    (2006.01)
(Continued)

(52) U.S. Cl.
CPC .......... *H01L 41/1871* (2013.01); *C04B 35/49* (2013.01); *C04B 35/6261* (2013.01);
(Continued)

(58) Field of Classification Search
None
See application file for complete search history.

(56) References Cited

U.S. PATENT DOCUMENTS

| 7,568,792 B2 | 8/2009 | Takabe et al. |
| 8,182,713 B2 | 5/2012 | Ren et al. |

(Continued)

FOREIGN PATENT DOCUMENTS

| CN | 1953947 A | 4/2007 |
| CN | 104891987 A | 9/2015 |

(Continued)

OTHER PUBLICATIONS

Ajay Kumar Kalyani et al., "Orthorhombic-Tetragonal Phase Coexistence and Enhanced Piezo-Response at Room Temperature in Zr, Sn, and Hf modified BaTiO3," 104 Appl. Phys. Lett. 252906 (1-5) (Jun. 2014).

(Continued)

*Primary Examiner* — Erica S Lin
(74) *Attorney, Agent, or Firm* — Venable LLP

(57) ABSTRACT

Provided is a piezoelectric ceramics including crystal grains each including: a first region that is formed of a perovskite-type metal oxide having a crystal structure in which a central element of a unit cell is located at an asymmetrical position; and a second region that is formed of a perovskite-type metal oxide having a crystal structure in which a central element of a unit cell is located at a symmetrical position, and that is present inside the first region, wherein a ratio of a cross-sectional area of the second region to a cross-sectional area of the piezoelectric ceramics is 0.1% or less.

17 Claims, 9 Drawing Sheets

(51) Int. Cl.

| | |
|---|---|
| *C04B 35/49* | (2006.01) |
| *C04B 35/626* | (2006.01) |
| *C04B 35/634* | (2006.01) |
| *C04B 35/64* | (2006.01) |
| *H01L 41/047* | (2006.01) |
| *H01L 41/083* | (2006.01) |
| *H04R 17/02* | (2006.01) |

(52) U.S. Cl.
CPC .. *C04B 35/62695* (2013.01); *C04B 35/63416* (2013.01); *C04B 35/64* (2013.01); *H01L 41/0471* (2013.01); *H01L 41/0472* (2013.01); *H01L 41/083* (2013.01); *H04R 17/02* (2013.01); *C04B 2235/3236* (2013.01); *C04B 2235/604* (2013.01); *C04B 2235/6567* (2013.01); *C04B 2235/762* (2013.01); *C04B 2235/768* (2013.01); *C04B 2235/77* (2013.01); *C04B 2235/786* (2013.01); *C04B 2235/87* (2013.01)

(56) References Cited

U.S. PATENT DOCUMENTS

| | | | |
|---|---|---|---|
| 9,231,188 B2 | 1/2016 | Suzuki et al. | |
| 9,412,931 B2 | 8/2016 | Shimada et al. | |
| 9,614,141 B2 | 4/2017 | Shimizu et al. | |
| 9,680,085 B2 | 6/2017 | Furuta et al. | |
| 9,842,985 B2 | 12/2017 | Suzuki et al. | |
| 2014/0009038 A1* | 1/2014 | Matsuda ............... | B41J 2/1623 310/365 |
| 2014/0131611 A1 | 5/2014 | Hayashi et al. | |
| 2016/0204336 A1* | 7/2016 | Shimizu ............... | H01L 41/083 310/317 |
| 2016/0268045 A1 | 9/2016 | Kaneko et al. | |
| 2017/0101345 A1 | 4/2017 | Shimada et al. | |
| 2017/0155037 A1* | 6/2017 | Kubota ............... | B06B 1/06 |
| 2018/0233655 A1 | 8/2018 | Saito et al. | |

FOREIGN PATENT DOCUMENTS

| | | |
|---|---|---|
| JP | 2006-278489 A | 10/2006 |
| JP | 2010-265146 A | 11/2010 |
| JP | 5344456 B2 | 11/2013 |
| JP | 2016-147798 A | 8/2016 |

OTHER PUBLICATIONS

Extended European Search Report in European Application No. 19178038.6 (dated Nov. 22, 2019).
Notice of Reasons for Refusal in Japanese Application No. 2019-102084 (dated Feb. 2023).
Peter Neumeister et al., "Effective Permittivity of Air-Filled Cracks in Piezoelectric Ceramics Due to Crack Bridging," 61 Acta Materialia 1061-1069 (2013).
Lingfang Xu et al., "Fabrication and Properties of Lead Lanthanum Zirconate Titanate Fiber 1-3 Piezoelectric Composites," Journal of the Chinese Ceramic Society 1152-1156 (Sep. 2007).
Chang-rong Zhou et al., "Microstructure and Electrical Properties of Bi-Based Lead-Free Piezoelectric Ceramics Bi0.5 (Na0.82K0.18)0.5TiO3-BiCrO3," 19(7) The Chinese Journal of Nonferrous Metals 1289-1293 (Jul. 2009).
Zhi-Yong Zhou et al, "Research Progress of Pervoskile Layer Structured Piezoelectric Ceramics with Super High Curie Temperature," 33(3) Journal of Inorganic Materials 251-258 (Mar. 2008).
Cuimin Lu et al., "Sintering Process and Properties of 0.98Bi0.5(Na0.82K0.18)0.5TiO3-02NaNbO3 Lead-Free Piezoelectric Ceramics," 46(24) Functional Materials 24100-24104 (105).
First Office Action in Chinese Application No. 201810488552.4 (dated Mar. 2023).

* cited by examiner

PIEZOELECTRIC CERAMICS, PIEZOELECTRIC ELEMENT, AND ELECTRONIC APPARATUS

BACKGROUND OF THE INVENTION

Field of the Invention

The present invention relates to a piezoelectric ceramics, and more particularly, to a lead-free piezoelectric ceramics. The present invention also relates to a piezoelectric element and an electronic apparatus each using the piezoelectric ceramics.

Description of the Related Art

As a piezoelectric ceramics, a perovskite-type metal oxide represented by the chemical formula $ABO_3$, such as lead zirconate titanate (hereinafter referred to as "PZT"), is generally used. Such material is used in a variety of piezoelectric devices, such as an actuator, an oscillator, a sensor, and a filter. However, PZT contains lead as an A site element, and hence a lead component in a discarded piezoelectric ceramics may elute into soil to adversely affect an ecosystem. Accordingly, in order to make a piezoelectric device lead-free, a novel lead-free piezoelectric ceramics has been actively developed.

Barium titanate is known as a lead-free perovskite-type piezoelectric ceramics. In addition, for the purpose of improving its piezoelectric characteristics, a ceramics based on the composition of barium titanate has been developed.

In Applied Physics Letters 104, 252906 (2014), there is described that a piezoelectric constant is increased by substituting a Ti site with Zr or the like in an appropriate amount. However, according to FIG. 3 of Applied Physics Letters 104, 252906 (2014), there is described that a Curie temperature is lowered depending on the substitution amount of Zr. As described above, the piezoelectric constant and the Curie temperature are in a trade-off relationship.

In addition, in Japanese Patent No. 5344456, there is disclosed a material in which piezoelectric characteristics are improved by substituting part of an A site of barium titanate with Ca and part of a B site of barium titanate with Zr. However, according to FIG. 1 of Japanese Patent No. 5344456, the material has a Curie temperature as low as less than 100° C., and has low durability at high temperature, and hence its application to an electronic apparatus is difficult.

SUMMARY OF THE INVENTION

The present invention has been made in order to solve the above-mentioned problems, and provides a piezoelectric ceramics that has a high piezoelectric constant while maintaining a Curie temperature by adopting a new crystal microstructure.

The present invention also provides a piezoelectric element and an electronic apparatus each using the piezoelectric ceramics and excellent in driving characteristics.

According to one embodiment of the present invention, there is provided a piezoelectric ceramics including crystal grains each including: a first region formed of a perovskite-type metal oxide having a crystal structure in which a central element of a unit cell is located at an asymmetrical position; and a second region formed of a perovskite-type metal oxide having a crystal structure in which a central element of a unit cell is located at a symmetrical position, and is present inside the first region, wherein a ratio of a cross-sectional area of the second region to a cross-sectional area of the piezoelectric ceramics is 0.1% or less.

According to one embodiment of the present invention, there is provided a piezoelectric element including: a first electrode; a piezoelectric ceramics portion; and a second electrode, wherein a piezoelectric ceramics for forming the piezoelectric ceramics portion includes the piezoelectric ceramics according to the embodiment of the present invention.

According to one embodiment of the present invention, there is provided an electronic apparatus, including the piezoelectric element according to the embodiment of the present invention.

According to the one embodiment of the present invention, the piezoelectric ceramics that achieves both the high piezoelectric constant and the high Curie temperature can be provided. In addition, according to the one embodiment of the present invention, the piezoelectric element, the piezoelectric element having a multilayered structure, and the electronic apparatus each using the piezoelectric ceramics and excellent in driving characteristics can be provided.

Further features of the present invention will become apparent from the following description of exemplary embodiments with reference to the attached drawings.

DESCRIPTION OF THE EMBODIMENTS

Figure 1:
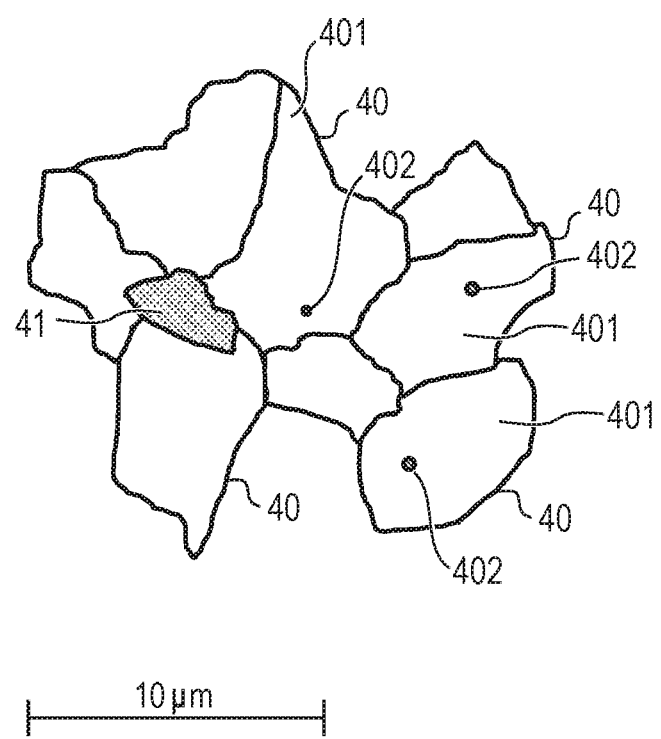
FIG. 1 is a conceptual view for illustrating a piezoelectric ceramics according to one embodiment of the present invention.

Embodiments of the present invention are hereinafter described.

(Piezoelectric Ceramics)

The term "ceramics" as used herein refers to an aggregate (bulk body) of crystal grains that contains a metal oxide as a basic component and is baked (sintered) by heat treatment (firing). The ceramics refers to a so-called polycrystal, and includes ones processed after sintering. However, the ceramics does not include powder and a slurry having dispersed therein powder.

A piezoelectric ceramics according to one embodiment of the present invention includes crystal grains each including: a first region that is formed of a perovskite-type metal oxide having a crystal structure in which a central element of a unit cell is located at an asymmetrical position; and a second region that is formed of a perovskite-type metal oxide having a crystal structure in which a central element of a unit cell is located at a symmetrical position, and that is present inside the first region, wherein a ratio of a cross-sectional area of the second region to a cross-sectional area of the piezoelectric ceramics is 0.1% or less.

The perovskite-type metal oxide is generally represented by the chemical formula $ABO_3$. In the perovskite-type metal oxide, elements A and B occupy specific positions in a unit cell, which are called an A site and a B site, respectively, in the form of ions. For example, in the case of a cubic unit cell, the A site element occupies the corners of a cubic, and the B site element occupies a body-centered position of the cubic. An O element occupies the face-centered position of each of the planes forming the cubic as an anion of oxygen. When the cubic unit cell is distorted in the [001] direction, the [011] direction, and the [111] direction of the unit cell, crystal lattices having a tetragonal perovskite-type structure, an orthorhombic perovskite-type structure, and a rhombohedral perovskite-type structure are obtained, respectively.

In the present invention, a molar ratio (A/B) between A (mol) representing the A site and B (mol) representing the B site in the chemical formula $ABO_3$ is represented by Symbol "a". A case in which a value of the "a" is other than 1 also falls within the scope of the present invention as long as the metal oxide has a perovskite structure as a main phase.

In addition, in the chemical formula $ABO_3$, the molar ratio between the elements at the B site and the O element is 1:3, and the case where the ratio of element amounts is shifted slightly, for example, within 1% also falls within the scope of the present invention as long as the metal oxide has a perovskite structure as a main phase.

It can be determined, for example, by subjecting the piezoelectric ceramics to X-ray diffraction or electron beam diffraction that the metal oxide has a perovskite structure. As long as the perovskite structure is a main crystal phase, the piezoelectric ceramics may additionally contain another crystal phase.

The kind of the compound for forming the piezoelectric ceramics according to the one embodiment of the present invention is not particularly limited, and for example, PZT, barium titanate, barium calcium titanate, bismuth sodium titanate, lead titanate, lithium niobate, potassium sodium niobate, and bismuth ferrate, and metal oxides containing those compounds as main components may be used. In consideration of an influence of a lead component on an environment, the piezoelectric ceramics of the present invention is desirably formed of a lead-free metal oxide. A piezoelectric ceramics including a lead component at less than 1,000 ppm can be said to be a lead-free piezoelectric ceramics, because an influence of elution of the lead component can be eliminated.

A schematic view obtained by cutting the piezoelectric ceramics of the present invention along an arbitrary plane and observing the cross section is illustrated in FIG. 1. For ease of description, 8 representative crystal grains (grains) are extracted and illustrated as a figure, but in actuality, a large number of crystal grains are present outside FIG. 1 in a close contact manner.

The piezoelectric ceramics is formed mainly of a crystal grain 40 and a pore (void) 41. Further, the crystal grain 40 is formed of a first region 401 and a second region 402.

Figure 2A:
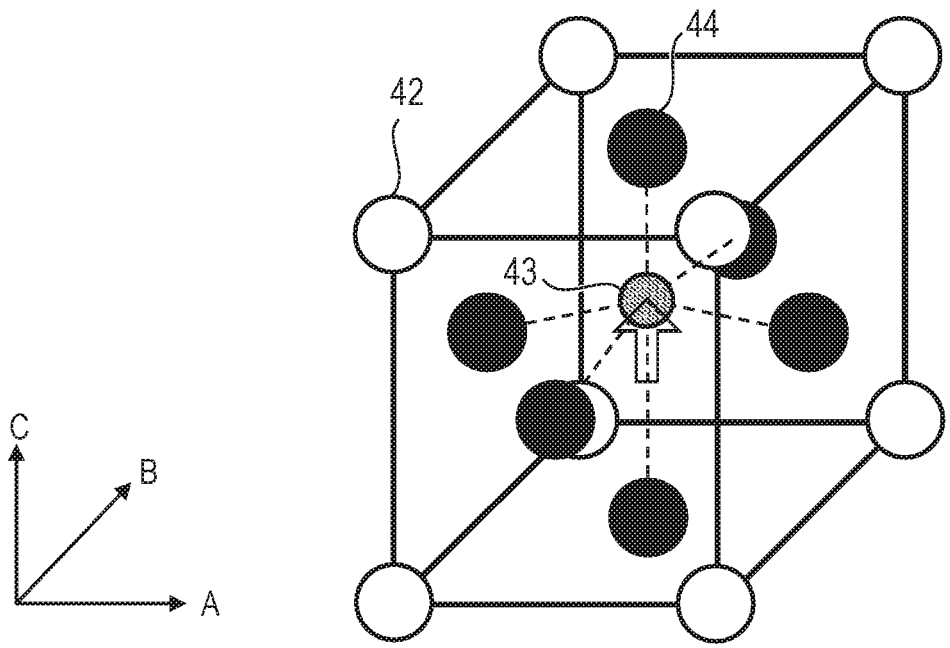
FIG. 2A and FIG. 2B are each a schematic view for illustrating a crystal structure of the piezoelectric ceramics of the present invention.

The first region 401 occupies large part of the volume of the piezoelectric ceramics. For example, the first region 401 has a feature of having a crystal structure in which a central element of a unit cell is located at an asymmetrical position as illustrated in FIG. 2A. FIG. 2A is an illustration of a tetragonal unit cell, in which an A site atom 42 is arranged at corners, an oxygen atom 44 is arranged at face-centered positions, and a B site atom 43 is arranged at a position shifted from a body-centered position in a positive direction of a C axis. When the first region 401 has a crystal structure in which a central element of a unit cell is located at an asymmetrical position as described above, the asymmetrical position of the central element is switched in an opposite direction with an external electric field, and hence a piezoelectric effect is exhibited. In addition, a temperature at which the central element is shifted from the asymmetrical position to a symmetrical position by external heat is a Curie temperature of the piezoelectric ceramics, and hence the crystal structure of the first region 401 is a crystal structure that determines the Curie temperature of the piezoelectric ceramics. That is, as the ratio of the area of the first region 401 in the piezoelectric ceramics becomes larger, the Curie temperature can be increased more.

Figure 2B:
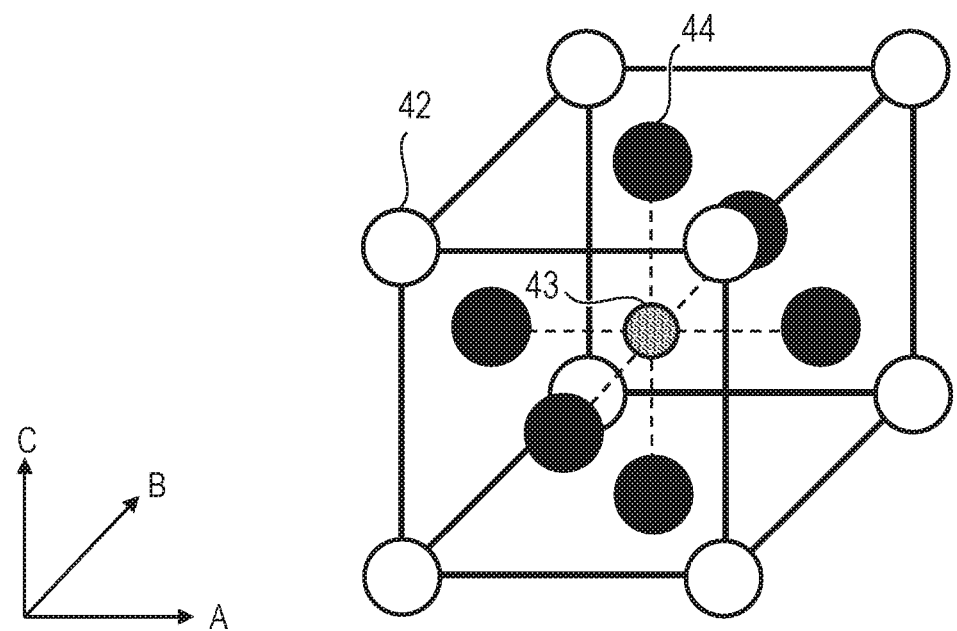

Meanwhile, the second region 402 occupies small part of the volume of the piezoelectric ceramics, and is present inside the first region 401. For example, the second region 402 has a feature of having a crystal structure in which a central element of a unit cell is located at a symmetrical position as illustrated in FIG. 2B. FIG. 2B is an illustration of a cubic unit cell, in which an A site atom 42 is arranged at corners, an oxygen atom 44 is arranged at face-centered positions, and a B site atom 43 is arranged at a body-centered position. The second region 402 having a crystal structure in which a central element of a unit cell is located at a symmetrical position as described above becomes a paraelectric substance, and does not exhibit a piezoelectric effect by itself. However, when the second region 402 is present so as to be included in the first region 401 under the state in which its unit cell joins with the first region 401, the second region 402 has an effect of distorting the unit cell of the first region 401 and thus reducing symmetry of the unit cell of the first region 401. Therefore, an effect of further increasing a piezoelectric constant exhibited by the first region 401 can be provided. In addition, when the unit cell of the first region 401 is distorted, the crystal structure of the piezoelectric ceramics is further stabilized. The unit cell of a crystal of the second region 402 continuously joins with the surrounding first region 401. That is, the respective second regions 402 independent from each other belong to the same crystal grains 40 as their surrounding first regions 401.

The ratio of the cross-sectional area of the second region 402 to the cross-sectional area of the piezoelectric ceramics of the present invention may be calculated based on a sectional observation image illustrated in FIG. 1. There are given, for example, a method involving using a scanning electron microscope (SEM) and a method involving observing with a transmission electron microscope (TEM). For example, in the case of using a scanning electron microscope, a cross section of the piezoelectric ceramics is observed based on a backscattered electron image of the scanning electron microscope. In the above-mentioned observation method, the first region 401 and the second region 402 are observed with different contrasts, and hence the ratio in cross-sectional area may be determined by distinguishing these regions. A calculation method for the ratio in cross-sectional area is as described below. The ratio of a cross-sectional area corresponding to the first region (the first region 401 of FIG. 1) to the total area of the piezoelectric ceramics to be observed in a sectional observation image as illustrated in FIG. 1 is defined as the "ratio of the cross-sectional area of the first region." Similarly, the ratio of a cross-sectional area corresponding to the second region (the second region 402 of FIG. 1) to the total area of the piezoelectric ceramics is defined as the "ratio of the cross-sectional area of the second region." The pore 41 and a portion having a non-perovskite-type structure are also included in the total area to be observed.

In order to calculate the ratio of the cross-sectional area of the first region 401 or the ratio of the cross-sectional area of the second region 402 accurately, it is preferred to acquire the image at high resolution. When the image is acquired at high resolution, calculation accuracy of the ratio of the cross-sectional area of each region can be increased. In addition, when the image cannot be acquired at high resolution because, for example, the diameter of the crystal grain 40 is small, it is desired to increase the calculation accuracy by calculating the ratio based on a larger number of sectional observation images.

In the piezoelectric ceramics of the present invention, the crystal structures of the first region 401 and the second region 402 may each be specified by comparing a diffraction image acquired by subjecting the region to selected area diffraction method with a transmission electron microscope (TEM) and a database based on a known literature. A selected area observation method refers to a method involving observing only a diffraction pattern of a specific region in an enlarged image observed with a transmission electron microscope (TEM). This method enables the observation of only a diffraction pattern resulting from the region. In addition, the first region 401 occupies large part of the piezoelectric ceramics, and hence may also be specified by crystal structure analysis based on X-ray diffraction of the piezoelectric ceramics.

In the piezoelectric ceramics of the present invention, the compositions of the first region 401 and the second region 402 may each be analyzed by, for example, a STEM-EDX method. The STEM-EDX method refers to a method involving measuring a fluorescent X-ray intensity by energy dispersive X-ray spectrometry (EDX) in an arbitrary position of a sample image observed by scanning transmission electron microscopy (STEM).

In the piezoelectric ceramics of the present invention, the lattice spacings of the first region 401 and the second region 402 may each be determined as follows: a lattice image is observed with a TEM, the lattice image is subjected to Fourier transform, and the lattice spacing is determined based on a profile of a fast Fourier transform (FFT) image.

Further, in the piezoelectric ceramics of the present invention, the details of the crystal structures of the first region 401 and the second region 402 may each be determined based on the diffraction pattern with the electron microscope, and the composition and the value of the lattice spacing of the region. In addition, in the piezoelectric ceramics of the present invention, the space groups representing the crystal structures of the first region 401 and the second region 402 may each be determined based on the diffraction pattern with the electron microscope, and the composition and the value of the lattice spacing of the region.

The piezoelectric ceramics of the present invention has a feature that the ratio of the cross-sectional area of the second region 402 to the cross-sectional area of an arbitrary cross section of the piezoelectric ceramics is 0.1% or less. When the above-mentioned ratio in cross-sectional area is 0.1% or less, the unit cell of the first region 401 is distorted, and a piezoelectric ceramics having a high piezoelectric constant can be provided. The ratio of the cross-sectional area of the second region 402 is more preferably 0.05% or less. When the above-mentioned ratio in cross-sectional area is 0.05% or less, a piezoelectric ceramics having a high piezoelectric constant while maintaining a Curie temperature can be provided.

Meanwhile, when the above-mentioned ratio in cross-sectional area is more than 0.1%, there is a risk in that the crystal structure of the first region 401 may be disrupted to lower the Curie temperature. Thus, there is a risk in that achievement of both a high piezoelectric constant and a high Curie temperature, which is the effect of the present invention, becomes impossible.

When the ratio of the cross-sectional area of the second region 402 is 0.01% or more, the piezoelectric constant can be increased by 2% or more as compared to that of a piezoelectric ceramics formed only of the first region 401 having the same composition.

The ratio of the cross-sectional area of the second region 402 is more preferably 0.03% or more. When the above-mentioned ratio in cross-sectional area is 0.03% or more, the piezoelectric constant can be increased by 3% or more as compared to that of the piezoelectric ceramics formed only of the first region 401 having the same composition.

The ratio of the cross-sectional area of the first region 401 in the piezoelectric ceramics of the present invention may be calculated based on the sectional observation image illustrated in FIG. 1 in the same manner as in the case of the ratio of the cross-sectional area of the second region 402.

In the piezoelectric ceramics of the present invention, the ratio of the cross-sectional area of the first region 401 to the cross-sectional area of an arbitrary cross section of the piezoelectric ceramics is preferably 98% or more. When the above-mentioned ratio in cross-sectional area is 98% or more, a piezoelectric ceramics having a high Curie temperature while maintaining a high piezoelectric constant can be provided.

Meanwhile, when the ratio of the cross-sectional area of the first region 401 is less than 98%, there is a risk in that the Curie temperature is lowered owing to the presence of a region in which a change in structure easily occurs in association with a change in environmental temperature.

(Crystal Grain)

It is preferred that a peripheral portion of the crystal grain 40 of the piezoelectric ceramics of the present invention be occupied by the first region 401. The fact that the peripheral portion of the crystal grain 40 is occupied by the first region 401 may be confirmed by observing that a domain structure of the crystal grain 40 is present in the vicinity of a grain boundary with a SEM or the like.

When the peripheral portion of the crystal grain 40 is occupied by the first region 401, the crystal structure of the crystal grain 40 is stabilized, and the Curie temperature of the piezoelectric ceramics can be increased. Meanwhile, when the peripheral portion of the crystal grain 40 is occupied by a region different from the first region 401, the presence of a region having a different crystal structure from that of the first region 401 is implied, and by extension, the presence of a region having a different Curie temperature is implied. Such case is not preferred because the crystal structure of the piezoelectric ceramics becomes unstable, and the Curie temperature is lowered or a rate at which the piezoelectric characteristics deteriorate at a temperature lower than the Curie temperature is increased. In addition, when the region having a different crystal structure from that of the first region 401 is present, there is a risk in that the piezoelectric characteristics deteriorate.

In the present invention, the crystal grains 40 constituting the piezoelectric ceramics preferably have an average equivalent circular diameter of 1.0 µm or more and 10 µm or less. When the crystal grains 40 have an average equivalent circular diameter falling within the above-mentioned range, the piezoelectric ceramics of the present invention can have a satisfactory piezoelectric constant, a satisfactory mechanical quality factor (Qm), and satisfactory mechanical strength. In the present invention, the equivalent circular diameter of the crystal grain 40 refers to an "equivalent circular diameter of a projected area" generally called in a microscopic observation method, and represents a diameter of a true circle having the same area as a projected area of the crystal grain 40 observed when a cross section of the piezoelectric ceramics is observed with a SEM or the like. The "crystal grain 40" as used herein refers to a region including the first region 401 and the second region 402 as in the crystal grain 40 of FIG. 1 and having a grain boundary with an adjacent region. In the grain boundary, the unit cells are brought into contact with each other discontinuously. In the present invention, a measurement method for the particle diameter is not particularly limited. For example, the particle diameter may be determined by subjecting the piezoelectric ceramics to treatment based on a sample preparation method specified in Japanese Industrial Standards (hereinafter abbreviated as JIS) R 1633 or the like, observing the obtained cross section of the piezoelectric ceramics based on JIS R 1670 or the like with, for example, a polarizing microscope or a SEM, and subjecting the obtained photographic image to image processing. An optimum magnification varies depending on the target particle diameter, and hence both an optical microscope and an electronic microscope may be used depending on the situation. The "average equivalent circular diameter" refers to a value obtained by averaging the equivalent circular diameters determined for all the crystal grains 40 in an observation field from which crystal grains 40 each protruding from the observation field at the time of observation are excluded. It is difficult to calculate the equivalent circular diameters of all the crystal grains 40 of the metal oxide in the piezoelectric ceramics, but the average equivalent circular diameter is calculated by appropriately adjusting the size and position of the observation field, and the number of observation fields so that the particle diameter distribution of the piezoelectric ceramics can be acquired properly based on JIS Z 8827-1 or the like.

When the average equivalent circular diameter is 1.0 µm or more, it is considered that tetragonal distortion in the crystal structure of the piezoelectric ceramics is increased, and hence a dielectric constant is increased, with the result that the piezoelectric constant d is increased. In addition, when the average equivalent circular diameter is 1.0 µm or more, it is considered that the ratio of an internal loss resulting from a crystal grain boundary or a boundary between domains (called a domain wall) to a dielectric loss tans is reduced, and hence a high Qm suitable as a piezoelectric ceramics is obtained.

The Qm is a factor representing an elastic loss owing to oscillation when the piezoelectric ceramics is evaluated as an oscillator. The magnitude of the Qm is observed as the sharpness of a resonance curve in the measurement of an impedance. That is, the Qm is a factor representing the sharpness of resonance of an oscillator. As the Qm becomes higher, a smaller energy is lost through oscillation. When an insulation property or the Qm is increased, in the case where the piezoelectric ceramics is turned into a piezoelectric element, and the piezoelectric element is driven by applying a voltage, the long-term reliability of the piezoelectric element can be ensured. The Qm may be measured in accordance with EM-4501A, which is the standard of Japan Electronics and Information Technology Industries Association.

Meanwhile, a case in which the crystal grains 40 have an average equivalent circular diameter of 10 µm or less is preferred because binding between the crystal grains 40 is enhanced, and the mechanical strength of the piezoelectric ceramics is increased.

(Curie Temperature)

The Curie temperature $T_C$ generally refers to a temperature in degrees Celsius (° C.) at or above which the piezoelectricity of the piezoelectric ceramics is lost. Herein, a temperature at which the dielectric constant becomes maximum in the vicinity of a phase transition temperature between a ferroelectric phase (which is often a tetragonal phase) and a paraelectric phase (cubic phase) is defined as the $T_C$. The $T_C$ may be specified by measuring the dielectric constant, for example, by applying an alternating electric field having a frequency of 1 kHz and an electric field intensity of 10 V/cm while changing a measurement temperature through use of an impedance analyzer.

The piezoelectric ceramics of the present invention preferably has a Curie temperature of 100° C. or more. By virtue of the presence of the Curie temperature at 100° C. or more, the piezoelectric ceramics of the present invention can maintain piezoelectricity even under a harsh condition of 80° C., which is assumed to occur in a car during the summer, and can have a satisfactory and stable piezoelectric constant in a wide practical temperature range.

(Piezoelectric Constant)

The piezoelectric constant and mechanical quality factor of the piezoelectric element may be determined by calculation, from the measurement results of a resonance frequency and an antiresonance frequency, which are obtained with a commercially available impedance analyzer, based on the standard of Japan Electronics and Information Technology Industries Association (JEITA EM-4501). This method is hereinafter referred to as resonance-antiresonance method.

The absolute value $|d_{31}|$ of the piezoelectric constant of the piezoelectric ceramics of the present invention when measured at an environmental temperature of 25° C. is preferably 80 pm/V or more. When the absolute value $|d_{31}|$ of the piezoelectric constant is 80 pm/V or more, in the case where the piezoelectric ceramics of the present invention is utilized for a piezoelectric device, satisfactory driving efficiency is exhibited. Meanwhile, when the absolute value $|d_{31}|$ of the piezoelectric constant is less than 80 pm/V, in the case where the piezoelectric ceramics of the present invention is utilized for a piezoelectric device, the driving efficiency is lowered, and a higher driving voltage is required in some cases.

(Relative Density)

The relative density (bulk density of a sintered body/theoretical density×100) of the piezoelectric ceramics of the present invention is preferably 93% or more and 100% or less. The "relative density" refers to a ratio of a measured density (bulk density of a sintered body) to a theoretical density calculated based on the lattice constant of the piezoelectric ceramics and the atomic weights of constituent elements of the piezoelectric ceramics. The lattice constant may be calculated by, for example, X-ray diffraction method. The density may be measured by, for example, the Archimedes method.

When the relative density is 93% or more, the piezoelectric ceramics can be said to be sufficiently densified, exhibits a high piezoelectric constant and a high mechanical quality factor, and further, is increased in mechanical strength. The relative density more preferably falls within a range of 95% or more and 100% or less.

(Barium Titanate-Based Metal Oxide)

A main component of the first region 401 according to the one embodiment of the piezoelectric ceramics of the present invention is not particularly limited, but the first region 401 more preferably contains barium titanate as a main component. Most of the related-art piezoelectric ceramics involved in a piezoelectric element are piezoelectric ceramics containing lead zirconate titanate as a main component. Therefore, it has been pointed out that, when, for example, the piezoelectric element is discarded to be exposed to acid rain or left in a harsh environment, a lead component in the piezoelectric ceramics has a possibility of eluting into soil to adversely affect an ecosystem. When the piezoelectric ceramics contains, as a main component, barium titanate having a content of lead of less than 1,000 ppm, a lead component in the piezoelectric ceramics has a low possibility of adversely affecting an environment even when, for example, the piezoelectric element is discarded to be exposed to acid rain or left in a harsh environment. In addition, out of piezoelectric ceramics each free of a lead component, the piezoelectric ceramics containing barium titanate as a main component has a high absolute value $|d|$ of a piezoelectric constant. Accordingly, a voltage required for obtaining the same distortion amount can be reduced.

(Composition Ratio of Barium Titanate-Based Metal Oxide)

In the present invention, it is more preferred that the barium titanate-based metal oxide contain Ca. Further, it is more preferred that the value of x, which represents the ratio of the content (mol) of Ca to A (mol) representing the total content of Ba and Ca, be 0.02 or more and 0.30 or less.

Through incorporation of Ca, a phase transition temperature (hereinafter referred to as "Tto") from a tetragonal crystal to an orthorhombic crystal at the time of temperature reduction, and a phase transition temperature (hereinafter referred to as "Tot") from an orthorhombic crystal to a tetragonal crystal at the time of temperature increase are lowered. When the value of x is 0.02 or more and 0.10 or less, the Tto and the Tot are each close to room temperature, and a large $|d_{31}|$ value (e.g., 150 pm/V or more) is obtained around room temperature (e.g., from 0° C. to 40° C.). In addition, a case in which the value of x is more than 0.10 is more preferred because the Tto and the Tot are each less than 0° C., and temperature dependence of the piezoelectric constant is reduced. Meanwhile, when the value of x is 0.30 or less, Ca is acceleratedly solid solved, and a firing retention temperature can be lowered.

In the present invention, it is more preferred that the barium titanate-based metal oxide contain Zr or Mn. Further, it is more preferred that the value of y, which represents the molar ratio of the content of Zr to B (mol) representing the total content of Ti, Zr, and Mn, be 0.01 or more and 0.095 or less.

Through incorporation of Zr, the temperatures Tto and Tot are increased. When the value of y is set to 0.01 or more, the Tto and the Tot are each close to room temperature, and the piezoelectric constant in an operation temperature range (e.g., from −30° C. to 60° C.) is increased. Therefore, electric power required for driving of, for example, a piezoelectric element, a piezoelectric element having a multilayered structure, a vibration wave motor, an optical device, and an electronic apparatus each using the piezoelectric ceramics can be reduced. Meanwhile, when the value of y is set to 0.095 or less, the $T_C$ is as high as, for example, 100° C. or more, and depolarization is further suppressed at the time of use at high temperature. Thus, the operation guaranteed temperature range of a piezoelectric device is expanded, and the lowering of the piezoelectric constant over time is reduced.

In the present invention, it is more preferred that the value of z, which represents the molar ratio of the content of Mn to B (mol) representing the total content of Ti, Zr, and Mn, be 0.003 or more and 0.012 or less.

The case in which the value of z falls within the range of from 0.003 or more and 0.012 or less is more preferred because the value of Qm at room temperature is 1,200 or more. Mn has a property of changing in valence from 2 to 4, and plays a role in compensating for a deficiency in charge balance in the piezoelectric ceramics. When the value of z is set to 0.003 or more, it is considered that the concentration of oxygen vacancies in a crystal lattice of the piezoelectric ceramics is increased, and a residual stress generated between the crystal grains owing to domain switching of a non-180-degree domain is reduced, with the result that the value of Qm is increased. Meanwhile, when the value of z is set to 0.012 or less, Mn is acceleratedly solid solved, and insulation resistance can be further increased. Mn is not limited to metallic Mn. Mn is only required to be contained as a Mn component in the piezoelectric ceramics, and any incorporation form is permitted. For example, Mn may be solid solved at a B site, or may be contained in a grain boundary. Alternatively, the Mn component may be contained in the piezoelectric ceramics in the form of, for example, a metal, an ion, an oxide, a metal salt, or a complex. Mn is more preferably present from the viewpoints of the insulation property and sinterability. While Mn may generally have a valence of 4+, 2+, or 3+, Mn serves as an acceptor when Mn has a valence of less than 4+. When Mn is present as an acceptor in a crystal having a perovskite structure, an oxygen vacancy is formed in the crystal. When the oxygen vacancy forms a defect dipole, the Qm of the piezoelectric ceramics can be increased. In order that Mn may be present with a valence of less than 4+, it is preferred that a trivalent element be present at an A site. The trivalent element is preferably Bi. In this connection, the valance of Mn may be evaluated by measuring temperature dependence of a magnetic susceptibility.

In the piezoelectric ceramics of the present invention, the value of A/B, which represents the ratio of A (mol) representing the total content of Ba and Ca to B (mol) representing the total content of Ti, Zr, and Mn, is preferably 0.98 or more and 1.01 or less. When the value of A/B falls within the above-mentioned range, the piezoelectric ceramics is easily densified, and thus the mechanical strength is increased. In addition, a temperature required for growth of the crystal grain 40 is lowered to 1,500° C. or less, at which firing can be performed with a general firing furnace.

The value of A/B preferably falls within a range of 0.990 or more and 0.999 or less. When the value of A/B falls within the above-mentioned range and the piezoelectric ceramics is fired at a temperature less than 1,400° C., the second region 402 of the present invention can be formed. The value of A/B more preferably falls within a range of 0.992 or more and 0.997 or less.

(Crystal Structure)

The crystal structure of the second region 402 according to the one embodiment of the piezoelectric ceramics of the present invention is preferably a cubic or $GdFeO_3$-type structure. The $GdFeO_3$-type structure refers to an orthorhombic perovskite-type structure in which a central element is located at a symmetrical position, and can be stably present even when adjacent to the first region 401. The fact that the second region 402 has a $GdFeO_3$-type structure may be determined by checking an electron beam diffraction pattern of the corresponding portion against a database. When the crystal structure of the second region 402 is a cubic or $GdFeO_3$-type structure, an effect of distorting the tetragonal unit cell of the first region 401, and the stability of the crystal structure can be ensured. Therefore, a piezoelectric ceramics having a high piezoelectric constant while maintaining a Curie temperature can be provided.

The space group representing the crystal structure of the second region 402 according to the piezoelectric ceramics of the present invention is preferably Pnma. The space group Pnma is a typical space group representing the $GdFeO_3$-type structure. When the space group representing the crystal structure of the second region 402 is Pnma, the effect of distorting the tetragonal unit cell of the first region 401, and the stability of the crystal structure can be ensured. Therefore, a piezoelectric ceramics having a high piezoelectric constant while maintaining a Curie temperature can be provided.

The space group representing the crystal structure of the first region 401 according to the piezoelectric ceramics of the present invention is preferably P4mm. The space group P4mm is a typical space group representing a tetragonal structure. When the space group representing the crystal structure of the first region 401 is P4mm, high piezoelectric characteristics can be exhibited in the presence of the second region 402 inside the first region 401.

The metal oxide forming the second region 402 according to the piezoelectric ceramics of the present invention preferably contains Ca and Ti. When the metal oxide forming the second region 402 contains Ca and Ti, the metal oxide easily has a crystal structure in which a central element of a unit cell is located at a symmetrical position. As a result, the effect of distorting the unit cell of the first region 401, and the stability of the crystal structure can be ensured.

The metal oxide forming the first region 401 according to the piezoelectric ceramics of the present invention preferably contains Ba and Ti. When the metal oxide forming the first region 401 contains Ba and Ti, the metal oxide easily has a crystal structure in which a central element of a unit cell is located at an asymmetrical position. As a result, a high piezoelectric constant can be exhibited in the presence of the second region 402 inside the first region 401.

Further, when the metal oxide forming the first region 401 contains Ba and Ti, and the metal oxide forming the second region 402 contains Ca and Ti, a case in which the piezoelectric ceramics of the present invention has an absolute density of 5.5 $g/cm^3$ or more and 5.8 $g/cm^3$ or less is preferred because a binding force between the crystal grains 40 of the piezoelectric ceramics is increased, and the mechanical strength is increased.

(Manufacturing Method for Piezoelectric Ceramics)

A manufacturing method for the piezoelectric ceramics according to the one embodiment of the present invention is not particularly limited, but a typical manufacturing method involving using a barium titanate-based metal oxide is described as an example below.

(Raw Materials)

As a manufacturing method for raw material powder of the piezoelectric ceramics according to the one embodiment of the present invention, a general technique involving sintering solid powder of, for example, an oxide, carbonate, nitrate, or oxalate containing constituent elements under normal pressure may be adopted. The solid powder is formed of a metal compound, such as a Ba compound, a Ca compound, a Ti compound, a Zr compound, or a Mn compound.

In particular, a case in which all the Ba compound, Ca compound, Ti compound, Zr compound, and Mn compound use perovskite-type metal oxides and are mixed is preferred because an effect of reducing the size of the crystal grain 40 after sintering is obtained, and the occurrence of cracks and chipping at the time of processing of the piezoelectric ceramics or a piezoelectric element can be further suppressed. In addition, such case is more preferred because the crystal grain 40 in which the second region 402 is present inside the first region 401 is formed.

Examples of the Ba compound that may be used include barium oxide, barium carbonate, barium oxalate, barium acetate, barium nitrate, barium titanate, barium zirconate, and barium zirconate titanate.

Examples of the Ca compound that may be used include calcium oxide, calcium carbonate, calcium oxalate, calcium acetate, calcium titanate, and calcium zirconate.

Examples of the Ti compound that may be used include titanium oxide, barium titanate, barium zirconate titanate, and calcium titanate.

Examples of the Zr compound that may be used include zirconium oxide, barium zirconate, barium zirconate titanate, and calcium zirconate.

Examples of the Mn compound that may be used include manganese carbonate, manganese monoxide, manganese dioxide, tetramanganese trioxide, and manganese acetate.

In addition, the raw materials are not particularly limited in order to adjust the ratio of the total number of moles of Ti, Zr, and Mn to the total number of moles of Ba and Ca. The Ba compound, the Ca compound, the Ti compound, the Zr compound, and the Mn compound have the same effect.

The value of A/B, which represents the ratio of A (mol) representing the total content of Ba and Ca to B (mol) representing the total content of Ti, Zr, and Mn, is more preferably adjusted to fall within a range of 0.98 or more and 1.01 or less. When the value of A/B is adjusted to fall within the above-mentioned range, the piezoelectric ceramics is easily densified, and thus the mechanical strength is increased. In addition, a temperature required for growth of the crystal grain 40 is lowered to 1,500° C. or less, at which firing can be performed with a general firing furnace.

The value of A/B is still more preferably adjusted to fall within a range of 0.990 or more and 0.999 or less. When the value of A/B is adjusted to fall within the above-mentioned range and the piezoelectric ceramics is fired at a temperature less than 1,400° C., the second region 402 of the present invention can be formed. Further, the value of A/B is more preferably adjusted to fall within a range of 0.992 or more and 0.997 or less.

(Step of Obtaining Granules for Forming)

A method of granulating the raw material powder of the piezoelectric ceramics according to the one embodiment of the present invention to obtain granules for forming is not particularly limited. As a binder that may be used at the time of granulation, there are given, for example, polyvinyl alcohol (PVA), polyvinyl butyral (PVB), and an acrylic resin. The amount of the binder to be added is preferably from 1 part by weight to 10 parts by weight, and from the viewpoint of an increase in density of a compact, is more preferably from 2 parts by weight to 5 parts by weight, with respect to 100 parts by weight of the raw material powder of the piezoelectric ceramics. It is appropriate to granulate mixed power obtained by mechanically mixing the Ba compound, the Ca compound, the Ti compound, the Zr compound, and the Mn compound, or to calcine these compounds at from about 800° C. to about 1,300° C., and then granulate the compounds. Alternatively, it is appropriate to calcine the Ba compound, the Ca compound, the Ti compound, and the Zr compound, and then add the Mn compound thereto together with the binder. Any method may be used as a granulation method, but from such a viewpoint that the grain sizes of the granulated powder for forming in the form of granules can be made more uniform, a spray drying method is the most preferred granulation method.

(Step of Obtaining Compact)

A method of producing a compact of the piezoelectric ceramics according to the one embodiment of the present invention is not particularly limited. The compact refers to a solid produced from raw material powder, granulated powder, or a slurry. As the method of producing the compact, uniaxial pressing, cold isostatic pressing, hot isostatic pressing, slip casting, extrusion molding, or the like may be used.

(Step of Obtaining Piezoelectric Ceramics by Sintering)

A method of sintering the piezoelectric ceramics according to the one embodiment of the present invention is not particularly limited. Examples of the sintering method include sintering using an electric furnace, sintering using a gas furnace, a conduction heating method, a microwave sintering method, a millimeter-wave sintering method, and hot isostatic pressing (HIP). The electric furnace and the gas furnace for the sintering may each be a continuous furnace or a batch furnace.

A firing temperature of the piezoelectric ceramics in the sintering method is not particularly limited. The firing temperature is preferably a temperature at which each compound reacts to cause sufficient crystal growth. The firing temperature is preferably 1,200° C. or more and 1,400° C. or less, more preferably 1,300° C. or more and 1,400° C. or less. When the ratio A/B, which represents the ratio between the A site and the B site, is set to fall within a range of 0.990 or more and 0.999 or less, the piezoelectric ceramics sintered at a temperature falling within the above-mentioned range can have formed therein the second region 402 of the present invention, and exhibits satisfactory piezoelectric performance while maintaining a Curie temperature. The ratio A/B more preferably falls within a range of 0.992 or more and 0.997 or less.

In order to stabilize the properties of the piezoelectric ceramics to be obtained by the sintering treatment with good reproducibility, it is appropriate that the sintering treatment be performed for 2 hours or more and 24 hours or less with the firing temperature being set constant in the above-mentioned range.

A sintering method such as a two-stage sintering method may be used, and a method that does not involve an abrupt temperature change is preferred in consideration of productivity.

(Piezoelectric Element)

Next, the piezoelectric element of the present invention is described.

Figure 3:
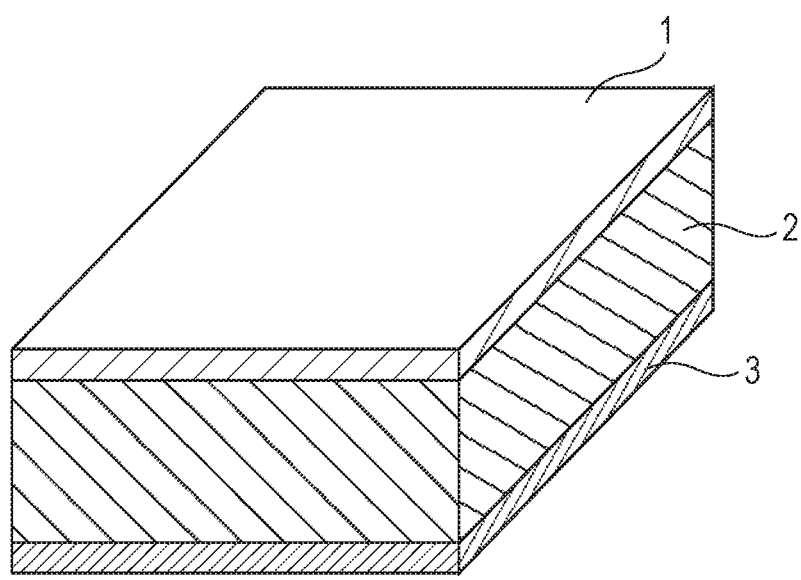
FIG. 3 is a schematic view for illustrating a configuration of a piezoelectric element according to one embodiment of the present invention.

FIG. 3 is a schematic view for illustrating the configuration of a piezoelectric element according to one embodiment of the present invention. The piezoelectric element according to the one embodiment of the present invention includes at least a first electrode 1, a piezoelectric ceramics portion 2, and a second electrode 3, wherein a piezoelectric ceramics forming the piezoelectric ceramics portion 2 is the piezoelectric ceramics of the present invention.

The piezoelectric property of the piezoelectric ceramics according to the one embodiment of the present invention may be evaluated by forming the piezoelectric element including at least the first electrode 1 and the second electrode 3. The first electrode 1 and the second electrode 3 are each formed of a conductive layer having a thickness of from about 5 nm to about 10 μm. A material therefor is not particularly limited, and only needs to be one to be generally used for a piezoelectric element. Examples thereof may include metals, such as Ti, Pt, Ta, Ir, Sr, In, Sn, Au, Al, Fe, Cr, Ni, Pd, Ag, and Cu, and compounds thereof.

Each of the first electrode 1 and the second electrode 3 may be formed of one kind of those materials, or may be obtained by stacking two or more kinds thereof. In addition, the first electrode 1 and the second electrode 3 may be formed of materials different from each other.

A production method for each of the first electrode 1 and the second electrode 3 is not limited. The first electrode 1 and the second electrode 3 may each be formed by baking a metal paste or by sputtering, vapor deposition, or the like. In addition, both the first electrode 1 and the second electrode 3 may be formed by patterning in desired shapes.

(Polarization Axis and Polarization Treatment)

It is more preferred that the piezoelectric element have polarization axes aligned in a certain direction. The "polarization axis" as used herein refers to the direction of spontaneous polarization of each crystal of a polycrystal constituting the piezoelectric ceramics. The "polarization axes aligned in a certain direction" means that the directions of spontaneous polarization of the crystals of the polycrystal are substantially the same. When the polarization axes are aligned in a certain direction, the piezoelectric constant of the piezoelectric element is increased. The fact that the polarization axes are aligned in a certain direction may be confirmed by, for example, the presence of remanent polarization in polarization-electric field (P-E) hysteresis measurement. In addition, other than the above, the fact that the polarization axes are aligned in a certain direction may be confirmed by a charge amount to be generated when a stress is applied with a d33 meter. When a charge amount measured with a d33 meter while the first electrode 1 is arranged upward and a charge amount measured with the d33 meter while the second electrode 3 is arranged upward have reversed signs, the polarization axes are aligned in a certain direction.

In general, ceramics is an aggregate of fine crystals, and each of the crystals is formed of a positively charged atom and a negatively charged atom. Most of ceramics are in the state in which a positive charge and a negative charge are balanced. However, out of dielectric ceramics, some ceramics called ferroelectric ceramics are each out of balance between a positive charge and a negative charge in a crystal on a microscale, and cause deviation of charges (spontaneous polarization) even in a natural state.

The ferroelectric ceramics after sintering has various directions of spontaneous polarization, and is apparently seen so as to be balanced in charge in the entirety of the ceramics. However, when a high voltage is applied thereto, the directions of spontaneous polarization are aligned in a uniform direction, and do not return even when the voltage is removed. The above-mentioned way in which the directions of spontaneous polarization are aligned and the polarization axes are aligned in a certain direction is generally referred to as polarization treatment. In addition, when an external voltage is applied to the ferroelectric ceramics subjected to the polarization treatment, a positive charge center and a negative charge center in the ceramics each attract or repel an external charge, and the ceramics itself expands or contracts (inverse piezoelectric effect).

Such polarization treatment does not correspond to a method of electrically short-circuiting two or more electrodes in the present invention.

A polarization treatment method for the piezoelectric element is not particularly limited. The polarization treatment may be performed in the air or in silicone oil. The optimum condition of a polarization treatment temperature varies depending on the composition of the piezoelectric ceramics forming the piezoelectric element. For example, in the case of a piezoelectric ceramics formed of a barium titanate-based metal oxide, the polarization treatment temperature is preferably from 80° C. to 150° C., which is close to the Curie temperature. In addition, an electric field to be applied for performing the polarization treatment is preferably from 800 V/mm to 2.0 kV/mm.

(Insulation Property)

The piezoelectric ceramics of the present invention preferably has a tan δ of 0.006 or less at 25° C. and a frequency of 1 kHz. The piezoelectric ceramics of the present invention preferably has a resistivity at 25° C. of 1 GΩcm or more. In the case where the tan δ is 0.006 or less, stable operation can be obtained even when an electric field of up to 500 V/cm is applied to the piezoelectric ceramics under the driving conditions of the piezoelectric element. When the resistivity is 1 GΩcm or more, the effect of the polarization treatment is sufficiently obtained. The tan δ and the resistivity may be measured by, for example, applying an alternating electric field having a frequency of 1 kHz and an electric field intensity of 10 V/cm through the use of an impedance analyzer.

(Piezoelectric Element Having Multilayered Structure)

Next, a piezoelectric element having a multilayered structure of the present invention is described.

The piezoelectric element having a multilayered structure according to the one embodiment of the present invention includes at least one internal electrode, and has a multilayered structure in which piezoelectric ceramics layers each formed of the piezoelectric ceramics and the at least one internal electrode in a form of a layer are alternately stacked.

Figure 4A:
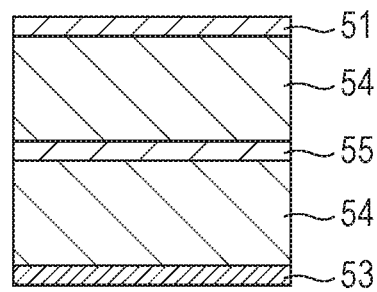
FIG. 4A and FIG. 4B are each a schematic sectional view for illustrating a configuration of a piezoelectric element having a multilayered structure according to one embodiment of the present invention.
Figure 4B:
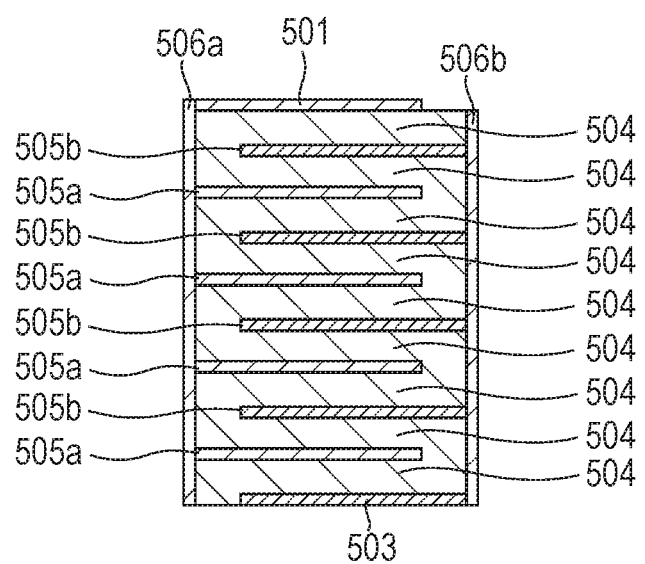

FIG. 4A and FIG. 4B are each a schematic sectional view for illustrating the configuration of a piezoelectric element having a multilayered structure according to one embodiment of the present invention. The piezoelectric element having a multilayered structure according to the one embodiment of the present invention includes piezoelectric ceramics portions (piezoelectric ceramics layers 54) and an electrode layer including an electrode (an internal electrode 55), which are alternately stacked. In the piezoelectric element having a multilayered structure, the piezoelectric ceramics layers 54 are each formed of the piezoelectric ceramics. The electrode layer may include external electrodes, such as an electrode (a first electrode 51) and an electrode (a second electrode 53), in addition to the internal electrode 55. FIG. 4A is an illustration of the configuration of the piezoelectric element having a multilayered structure of the present invention in which two layers of the piezoelectric ceramics layers 54 and one layer of the internal electrode 55 are alternately stacked, and the multilayered structure is sandwiched between the first electrode 51 and the second electrode 53. As illustrated in FIG. 4B, piezoelectric ceramics portions (the numbers of the piezoelectric ceramics layers 504) and electrodes (internal electrodes 505a and 505b) may be increased, and the numbers of the layers are not limited. In the piezoelectric element having a multilayered structure of FIG. 4B, nine layers of the piezoelectric ceramics layers 504 and eight layers of the internal electrodes 505 (505a or 505b) are alternately stacked. The multilayered structure has a configuration in which the piezoelectric ceramics layers 504 are sandwiched between electrodes (the first electrode 501 and the second electrode 503), and includes an external electrode 506a and an external electrode 506b for short-circuiting the alternately formed internal electrodes 505.

The internal electrodes 55 and 505, the external electrodes 506a and 506b, the first electrodes 51 and 501, and the second electrodes 53 and 503 do not need to be identical in size and shape to the piezoelectric ceramics layers 54 and 504, and may each be divided into a plurality of portions. The internal electrodes 55 and 505, the external electrodes 506a and 506b, the first electrodes 51 and 501, and the second electrodes 53 and 503 are each formed of a conductive layer having a thickness of from about 5 nm to about 10

μm. A material for each of the electrodes is not particularly limited and only needs to be one to be generally used for a piezoelectric element. Examples thereof may include metals, such as Ti, Pt, Ta, Ir, Sr, In, Sn, Au, Al, Fe, Cr, Ni, Pd, Ag, and Cu, and compounds thereof. Each of the internal electrodes 55 and 505 and the external electrodes 506a and 506b may be formed of one kind thereof, may be formed of a mixture or alloy of two or more kinds, or may be formed of a multilayered body of two or more kinds thereof. In addition, a plurality of electrodes may be respectively formed of materials different from each other.

The internal electrodes 55 and 505 each preferably contain Ag and Pd and have a weight ratio M1/M2 between a content weight M1 of Ag and a content weight M2 of Pd of 0.25 or more and 4.0 or less. The weight ratio M1/M2 is more preferably 0.3 or more and 3.0 or less. A case in which the weight ratio M1/M2 is less than 0.25 is not desired because a sintering temperature of the internal electrodes 55 and 505 is increased. Meanwhile, a case in which the weight ratio M1/M2 is more than 4.0 is not desired because the internal electrodes 55 and 505 become island-shaped, resulting in in-plane non-uniformity.

From the viewpoint that an electrode material is inexpensive, the internal electrodes 55 and 505 each preferably contain at least any one kind selected from the group consisting of Ni and Cu. When at least any one kind selected from the group consisting of Ni and Cu is used for the internal electrodes 55 and 505, the piezoelectric element having a multilayered structure of the present invention is preferably fired in a reducing atmosphere.

As illustrated in FIG. 4B, a plurality of electrodes including the internal electrodes 505 may be short-circuited to each other for the purpose of making the phases of their driving voltages uniform. For example, the internal electrode 505a and the first electrode 501 may be short-circuited through the external electrode 506a. The internal electrode 505b and the second electrode 503 may be short-circuited through the external electrode 506b. The internal electrode 505a and the internal electrode 505b may be alternately arranged. In addition, a mode in which the electrodes are short-circuited to each other is not limited. An electrode or wiring for short-circuiting may be provided on a side surface of the piezoelectric element having a multilayered structure, or the electrodes may be short-circuited to each other by forming a through-hole passing through the piezoelectric ceramics layers 504 and arranging a conductive material inside the through-hole.

(Electronic Apparatus)

Next, an electronic apparatus of the present invention is described. In the present invention, the electronic apparatus includes the piezoelectric element or the piezoelectric element having a multilayered structure.

Examples of the electronic apparatus include electronic apparatus including internal piezoelectric acoustic components, such as a speaker, a buzzer, and a microphone. Other than the above, as an electronic apparatus including the piezoelectric element as a driving source, there are given, for example, a liquid discharge device, a vibration device, a dust removing device, a movable mirror device, an ultrasonic oscillation device, a sensor device, and a shutter device.

Figure 5:
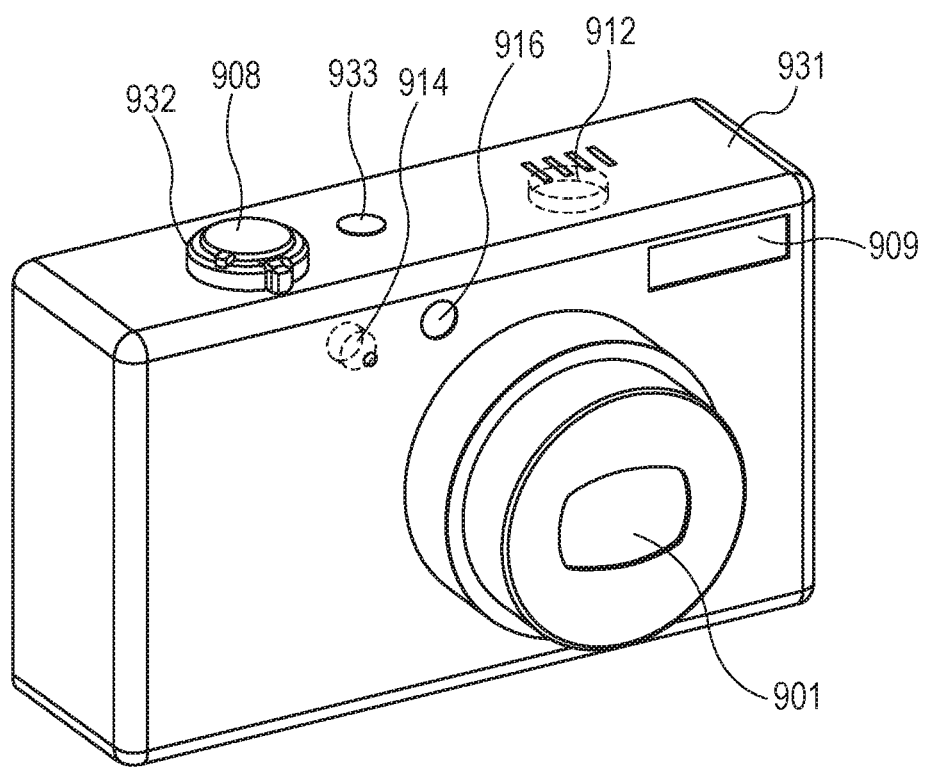
FIG. 5 is a schematic view for illustrating an electronic apparatus according to one embodiment of the present invention.
Figure 6A:
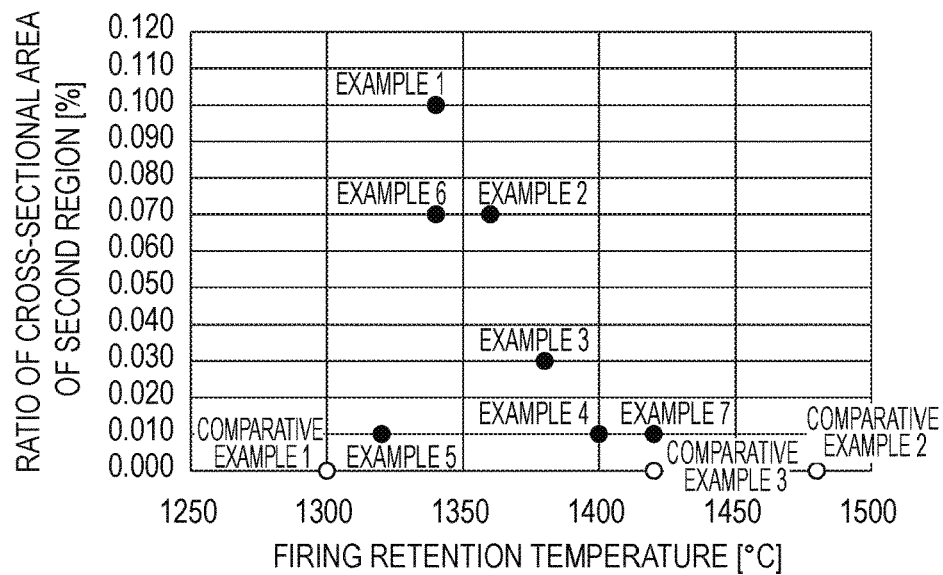
FIG. 6A is a graph for showing a relationship between a firing retention temperature and a ratio of a cross-sectional area of a second region in the cases of piezoelectric ceramics of Examples 1 to 7 and Comparative Examples 1 to 3 of the present invention shown in Table 1.
Figure 6B:
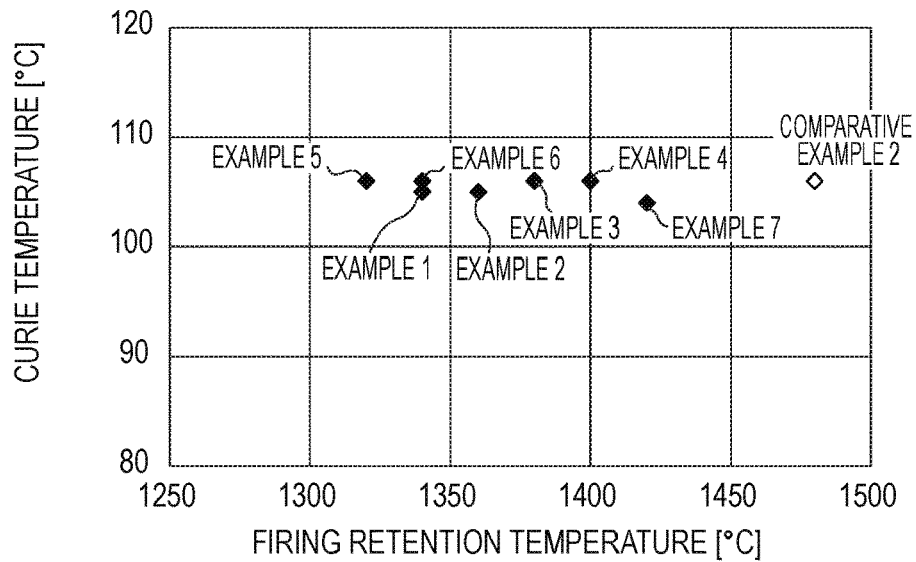
FIG. 6B is a graph for showing a relationship between a firing retention temperature and a Curie temperature in the cases of the piezoelectric ceramics of Examples 1 to 7 and Comparative Example 2 of the present invention shown in Table 1.
Figure 6C:
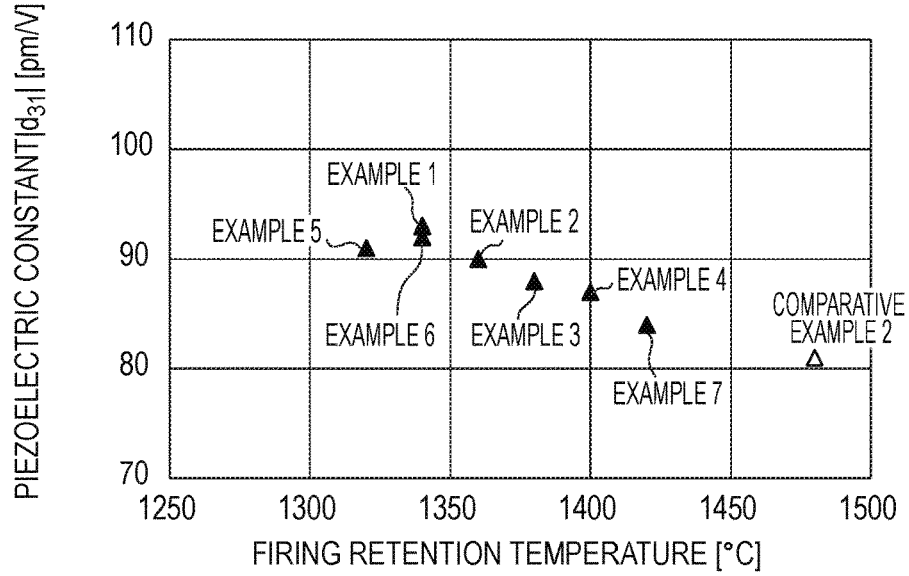
FIG. 6C is a graph for showing a relationship between a firing retention temperature and a piezoelectric constant in the cases of the piezoelectric ceramics of Examples 1 to 7 and Comparative Example 2 of the present invention shown in Table 1.
Figure 7A:
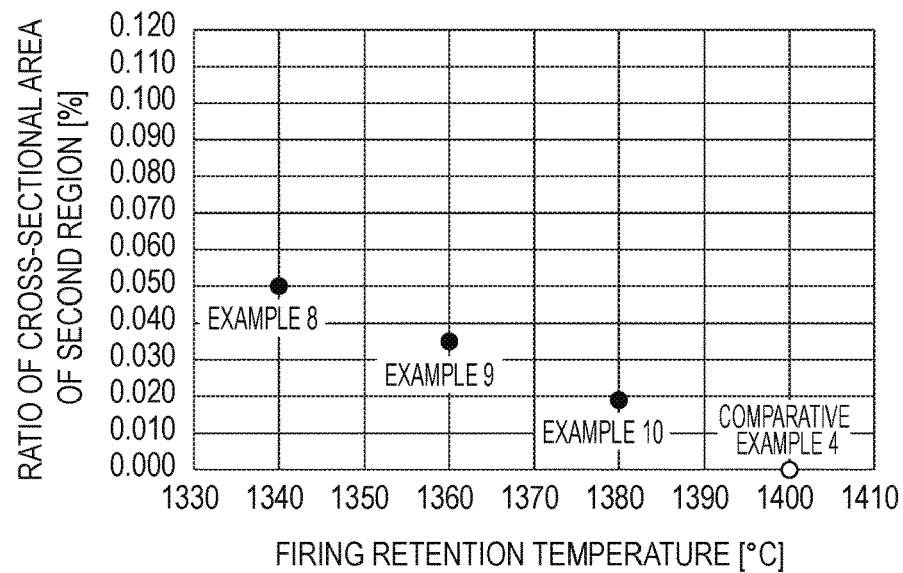
FIG. 7A is a graph for showing a relationship between a firing retention temperature and a ratio of a cross-sectional area of a second region in the cases of piezoelectric ceramics of Examples 8 to 10 and Comparative Example 4 of the present invention shown in Table 1.
Figure 7B:
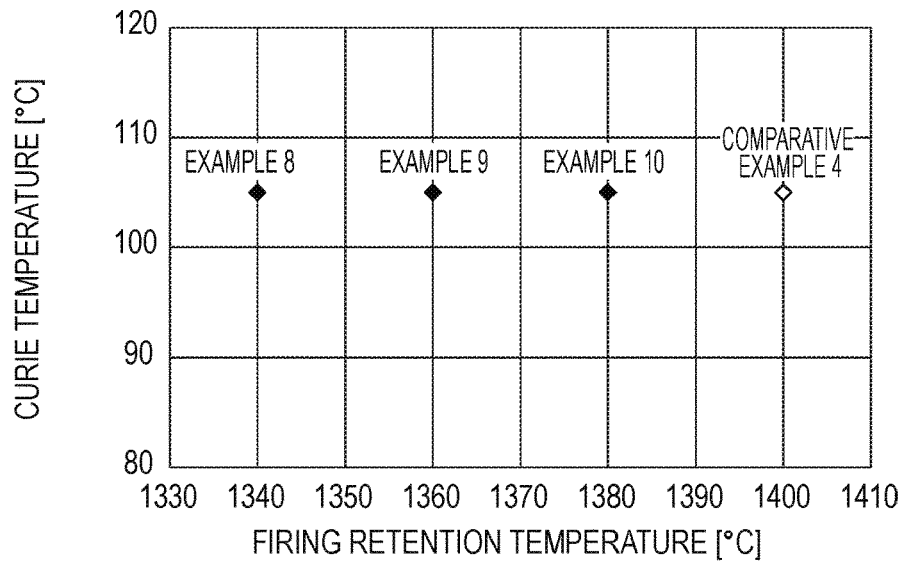
FIG. 7B is a graph for showing a relationship between a firing retention temperature and a Curie temperature in the cases of the piezoelectric ceramics of Examples 8 to 10 and Comparative Example 4 of the present invention shown in Table 1.
Figure 7C:
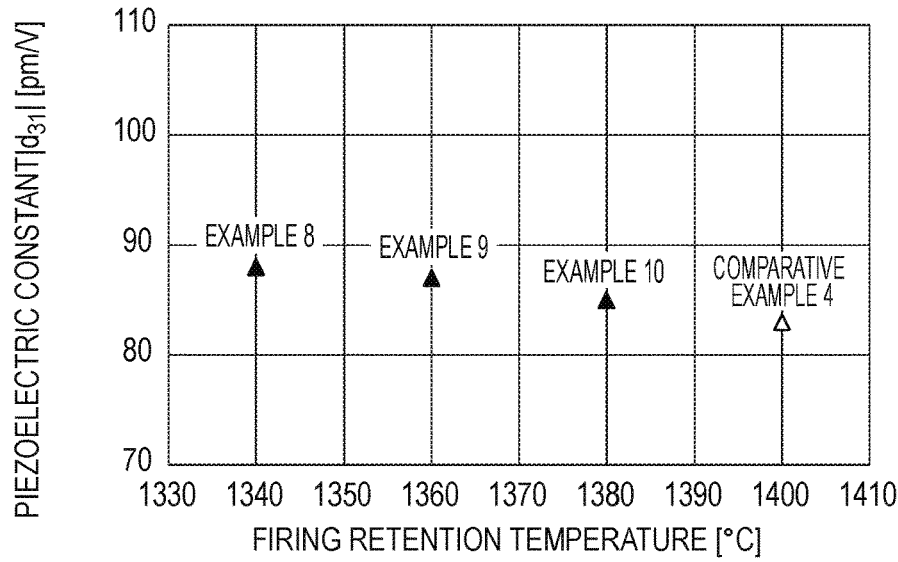
FIG. 7C is a graph for showing a relationship between a firing retention temperature and a piezoelectric constant in the cases of the piezoelectric ceramics of Examples 8 to 10 and Comparative Example 4 of the present invention shown in Table 1.
Figure 8A:
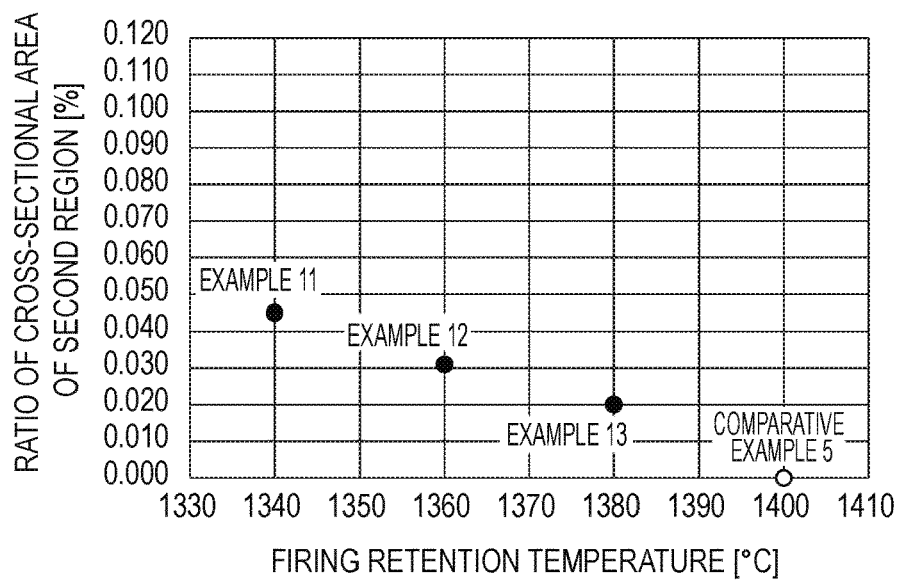
FIG. 8A is a graph for showing a relationship between a firing retention temperature and a ratio of a cross-sectional area of a second region in the cases of piezoelectric ceramics of Examples 11 to 13 and Comparative Example 5 of the present invention shown in Table 1.
Figure 8B:
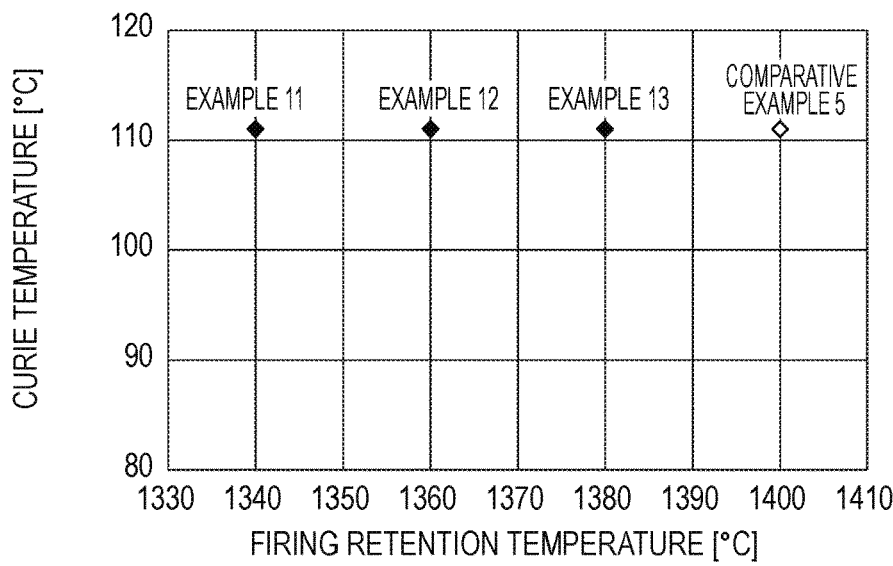
FIG. 8B is a graph for showing a relationship between a firing retention temperature and a Curie temperature in the cases of the piezoelectric ceramics of Examples 11 to 13 and Comparative Example 5 of the present invention shown in Table 1.
Figure 8C:
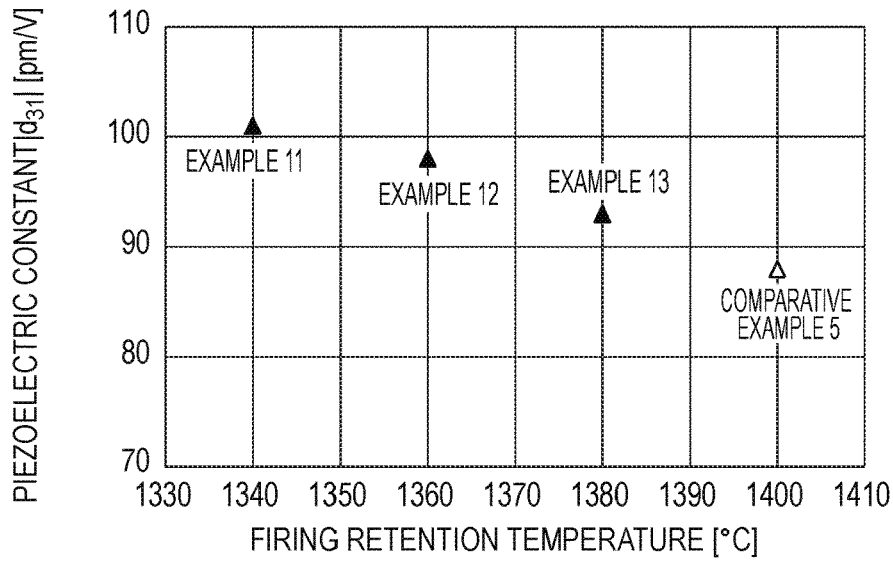
FIG. 8C is a graph for showing a relationship between a firing retention temperature and a piezoelectric constant in the cases of the piezoelectric ceramics of Examples 11 to 13 and Comparative Example 5 of the present invention shown in Table 1.
Figure 9A:
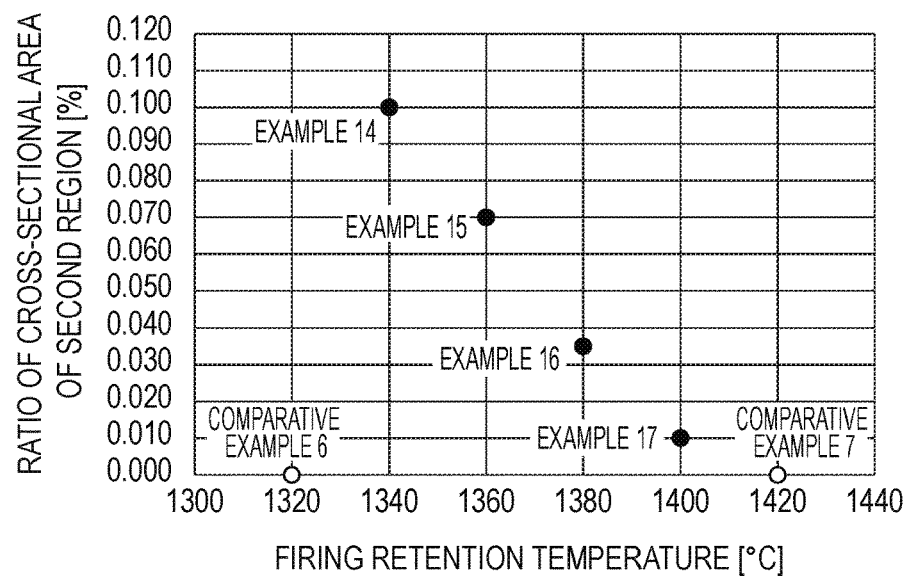
FIG. 9A is a graph for showing a relationship between a firing retention temperature and a ratio of a cross-sectional area of a second region in the cases of piezoelectric ceramics of Examples 14 to 17 and Comparative Examples 6 and 7 of the present invention shown in Table 1.
Figure 9B:
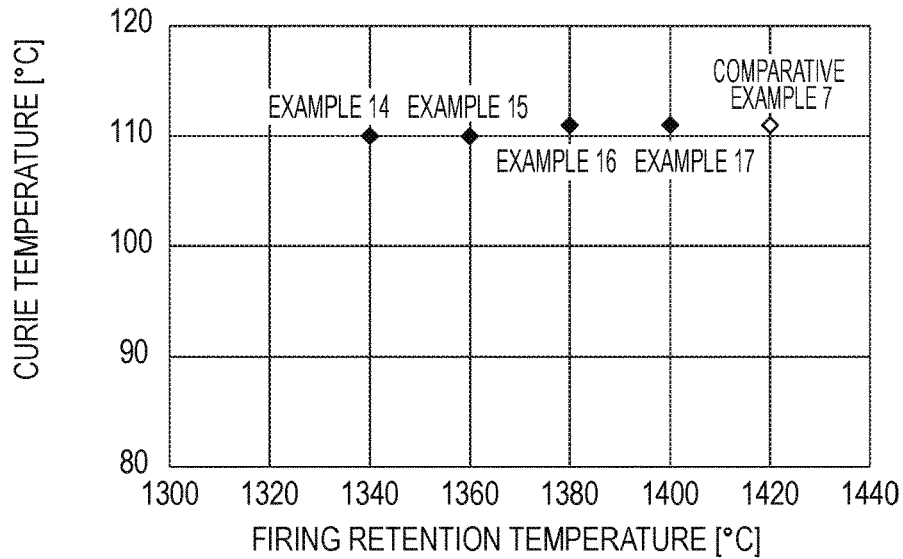
FIG. 9B is a graph for showing a relationship between a firing retention temperature and a Curie temperature in the cases of the piezoelectric ceramics of Examples 14 to 17 and Comparative Example 7 of the present invention shown in Table 1.
Figure 9C:
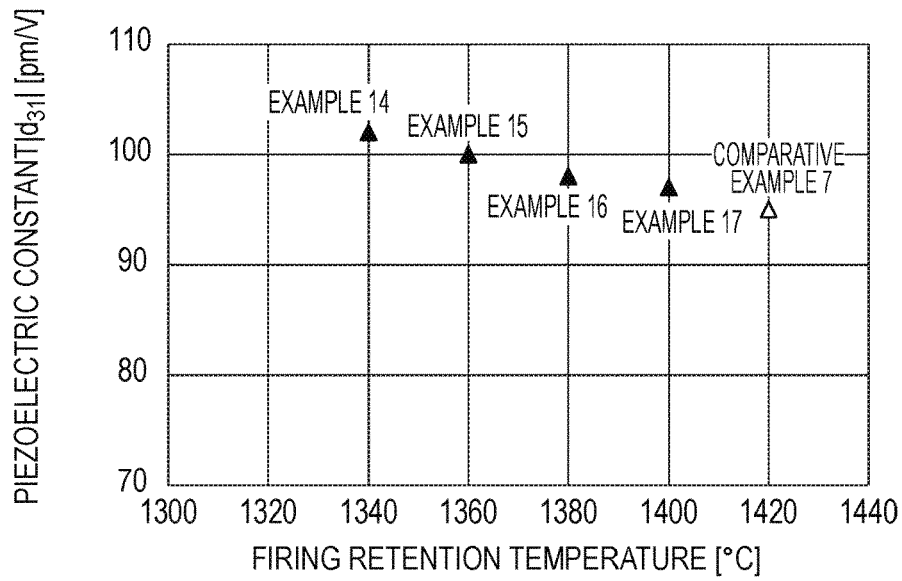
FIG. 9C is a graph for showing a relationship between a firing retention temperature and a piezoelectric constant in the cases of the piezoelectric ceramics of Examples 14 to 17 and Comparative Example 7 of the present invention shown in Table 1.

FIG. 5 is a general perspective view of a main body 931 of a digital camera as an example of an electronic apparatus according to a preferred embodiment of the present invention, as viewed from the front. An optical device 901, a microphone 914, a stroboscopic light emission unit 909, and a fill light unit 916 are arranged on a front surface of the main body 931 of the digital camera. The microphone 914 is installed in the main body, and hence is illustrated by a broken line. In the front of the microphone 914, there is a hole shape provided for collecting external sound.

A power button 933, a speaker 912, a zoom lever 932, and a release button 908 for performing a focus operation are arranged on the top surface of the main body 931. The speaker 912 is installed in the main body 931, and hence is illustrated by a broken line. In the front of the speaker 912, there is a hole shape provided for transmitting sound to the outside.

The piezoelectric element of the present invention is used as at least one of the microphone 914 or the speaker 912 of the digital camera as a piezoelectric acoustic component.

While the digital camera has been described as the electronic apparatus of the present invention, the electronic apparatus of the present invention can also be applied to various types of the electronic apparatus including the piezoelectric acoustic component, such as a sound reproduction device, a sound recording device, a cellular phone, or an information terminal.

As described above, the piezoelectric element and the piezoelectric element having a multilayered structure of the present invention are preferably used in a vibration wave motor, an optical device, and an electronic apparatus.

Through the use of the piezoelectric element and the piezoelectric element having a multilayered structure of the present invention, it is possible to provide the vibration wave motor having a driving force and durability comparable to or higher than those in the case of using the related-art piezoelectric element containing lead.

Through the use of the vibration wave motor of the present invention, it is possible to provide the optical device having durability and operation accuracy comparable to or higher than those in the case of using the related-art piezoelectric element containing lead.

Through the use of the piezoelectric acoustic component including the piezoelectric element or the piezoelectric element having a multilayered structure of the present invention, it is possible to provide the electronic apparatus having sound producing performance comparable to or higher than that in the case of using the related-art piezoelectric element containing lead.

The piezoelectric ceramics of the present invention can be used in devices such as an ultrasonic oscillator, a piezoelectric actuator, a piezoelectric sensor, and a ferroelectric memory, as well as the vibration wave motor and the electronic apparatus.

EXAMPLES

The piezoelectric ceramics of the present invention is hereinafter described by way of Examples. However, the present invention is not limited to the following Examples.

In order to produce piezoelectric ceramics of Examples and Comparative Examples of the present invention, barium titanate (average particle diameter: 300 nm, purity: 99.99% or more), calcium titanate (average particle diameter: 300 nm, purity: 99.99% or more), and calcium zirconate (average particle diameter: 300 nm, purity: 99.99% or more) each serving as a perovskite-type metal oxide, and trimanganese tetraoxide ($Mn_3O_4$) powder (purity: 99.5% or more), bismuth oxide ($Bi_2O_3$) powder (purity: 99.9% or more), barium carbonate ($BaCO_3$) powder (purity: 99.9% or more), and titanium oxide ($TiO_2$) powder (purity: 99.9% or more) were prepared.

Example 1

(Weighing and Mixing of Raw Materials of Piezoelectric Ceramics)

The above-mentioned raw materials were weighed so that, in a metal oxide represented by the formula $(Ba_{1-x}Ca_x)_a(Ti_{1-y-z}Zr_yMn_z)O_3$, the following composition ratios were obtained: X=0.187, Y=0.060, and Z=0.00952. In addition, the barium carbonate powder was weighed so that the "a" was adjusted to 0.9950. Those raw materials were dry mixed with a ball mill for 24 hours. Thus, mixed powder was produced.

(Granulation and Forming)

3 Parts by weight of a PVA binder with respect to 100 parts by weight of the total weight of the mixed powder was caused to adhere to the surface of the mixed powder with a spray dryer. Thus, granulated powder was obtained.

Next, the obtained granulated powder was filled in a mold, and a forming pressure of 200 MPa was applied thereto using a press molding machine to produce a disc-shaped compact. In addition, when the compact is further pressurized using a cold isostatic pressing molding machine, similar results were obtained.

(Firing)

The obtained compact was first heated to 600° C. and retained at the temperature in an air atmosphere with an electric furnace, and then increased in temperature up to 1,340° C. and retained at the temperature for 5 hours, and then decreased in temperature to room temperature by being naturally left to cool. Through the above-mentioned steps, a disc-shaped sintered compact (polycrystalline piezoelectric ceramics of Example 1) was obtained. The temperature at which the compact was retained was shown as a firing retention temperature (° C.) of Example 1 in Table 1.

(Analysis Method for Piezoelectric Ceramics)

The composition of the produced piezoelectric ceramics of Example 1 was evaluated by inductively coupled plasma (ICP) emission spectrometry. In this Example, the loading ratios of the raw materials agreed with an analysis value of the amount of Ca, an analysis value of the amount of Zr, and an analysis value of a ratio between the molar amount of Ba and Ca and the molar amount of Ti, Zr, and Mn in the metal oxide represented by the formula $(Ba_{1-x}Ca_x)_a(Ti_{1-y-z}Zr_yMn_z)O_3$ after the sintering.

A surface of the piezoelectric ceramics of Example 1 having been mirror polished was analyzed by X-ray diffraction method (XRD) with XRD-6100 manufactured by Shimadzu Corporation. As a result, it was found that a tetragonal crystal having a perovskite-type structure was included as a main phase.

A carbon film was laminated on the surface of the piezoelectric ceramics of Example 1 having been mirror polished, and a sectional observation image as shown in FIG. 1 was acquired based on a backscattered electron image of a SEM (Quanta 250 FEG: manufactured by FEI Japan). In the acquired sectional observation image, a region A, which occupied large part of a crystal grain 40, and a region B, which was present inside the region A, were confirmed based on a difference in contrast.

Further, an analysis sample having a size of 1 μm in thickness×10 μm in width×5 μm in length was cut out of a portion of the surface of the piezoelectric ceramics in which the region A and the region B were present with a focused ion beam. The sample was attached to a transmission electron microscope (TEM) observation grid, and irradiated with a focused ion beam parallel to a length direction of the sample to be processed so as to give a region having a width of about 5 μm and a sample thickness of about 100 nm.

The analysis sample was subjected to composition analysis of the region A and the region B with a STEM-EDX (Tecnai F30: manufactured by FEI Japan) by being irradiated with an electron beam in a thickness direction. As a result, it was confirmed that the region A was formed of $BaTiO_3$ containing Ca, Zr, and Mn. Meanwhile, it was presumed that the region B was formed of $CaTiO_3$ because Ca, Zr, and Mn were able to be confirmed but Ba was not able to be confirmed.

Further, an electron beam diffraction pattern of the region B was acquired by selected area diffraction method with a transmission electron microscope (TEM) (Tecnai F30: manufactured by FEI Japan). The composition information obtained from the composition analysis and the lattice spacing determined from the electron beam diffraction pattern were specified by being checked against a database based on a known literature. As a result, it was confirmed that the region B had a $GdFeO_3$ structure of $CaTiO_3$, which was an orthorhombic perovskite-type structure in which a central element was located at a symmetrical position.

From those results, it was revealed that the region A occupying large part of the crystal grain 40 corresponded to the first region 401 having a crystal structure in which a central element of a unit cell was located at an asymmetrical position. Meanwhile, it was revealed that the region B corresponded to the second region 402 having a crystal structure in which a central element of a unit cell was located at a symmetrical position.

In addition, the sectional observation image also included a pore 41 and a portion having a non-perovskite-type structure in addition to the first region 401 and the second region 402 each having a perovskite-type structure. Based on a difference in contrast of the image, a ratio in cross-sectional area, which was a ratio of each of the areas of the first region 401 and the second region 402 to the total observation area, was calculated. The calculated ratio in cross-sectional area is shown in Table 1. When the total of the ratios in cross-sectional area of the first region 401 and the second region 402 was less than 100%, the balance was occupied by the pore 41 and the portion having a non-perovskite-type structure.

In addition, in the sectional observation image, it was confirmed that a domain structure of the crystal grain 40 was present in the vicinity of a grain boundary.

The average equivalent circular diameter of crystal grains of the produced piezoelectric ceramics was mainly determined by analyzing an observation image obtained with a polarizing microscope using commercially available image processing software. In order to specify the particle diameters of small crystal grains, a scanning electron microscope (SEM) was used. The determined average equivalent circular diameter is shown in Table 1.

The absolute density of the produced piezoelectric ceramics was measured by the Archimedes method. The measured absolute density is shown in Table 1.

The relative density of the produced piezoelectric ceramics was determined by calculating a ratio between: a theoretical density calculated from the lattice constant of the piezoelectric ceramics and the atomic weights of the constituent elements; and the absolute density.

The calculated relative density is shown in Table 1.

(Production of Piezoelectric Element)

The obtained piezoelectric ceramics was polished so as to give a thickness of 0.5 mm, and then electrodes were formed on both a front surface and a back surface of the piezoelectric ceramics by a DC sputtering method. Specifically, titanium was formed into a film having a thickness of 30 nm as a contact layer, and then gold was formed into a film having a thickness of 400 nm. The piezoelectric ceramics with the electrodes was cut to produce a piezoelectric element of Example 1 having a configuration illustrated in FIG. 3 and a size of 10 mm×2.5 mm×0.5 mm.

The element was placed on a hot plate having a surface temperature of from 110° C. to 140° C. A direct current voltage was applied to the electrodes formed on both the surfaces of the piezoelectric element for 30 minutes so that an electric field intensity of 1.0 kV/mm was obtained, and then the element was left to cool to room temperature while the voltage was applied. Thus, polarization treatment was performed.

(Evaluation of Piezoelectric Constant and Curie Temperature)

The piezoelectric element of Example 1 was placed in a thermostatic chamber in which the ambient temperature was adjusted to 25° C., and the piezoelectric constant ($d_{31}$) of the piezoelectric element of Example 1 was determined by calculation, from the measurement results of a resonance frequency and an antiresonance frequency, which were obtained with a commercially available impedance analyzer (4294A Precision Impedance Analyzer: manufactured by Agilent Technologies, Inc.), based on the standard of Japan Electronics and Information Technology Industries Association (JEITA EM-4501).

The Curie temperature of the piezoelectric element of Example 1 was determined as described below. The dielectric constant was measured by applying a micro alternating electric field having a frequency of 1 kHz while a measurement temperature was changed. The Curie temperature was determined as a temperature at which the dielectric constant became maximum.

The piezoelectric constant and the Curie temperature determined as described above are shown as the piezoelectric constant and the Curie temperature of the piezoelectric ceramics of Example 1 in Table 1.

Examples 2 to 17 and Comparative Examples 1 to 7

Next, piezoelectric ceramics of Examples 2 to 10 and Comparative Examples 1 to 4 were each produced in the same manner as in Example 1 except that composition ratios (X, Y, Z, and a) in a metal oxide represented by the formula $(Ba_{1-x}Ca_x)_a(Ti_{1-y-z}Zr_yMn_z)O_3$ and a retention temperature were changed as shown in Table 1. In addition, in Examples 11 to 17 and Comparative Examples 5 to 7, piezoelectric ceramics of Examples 11 to 17 and Comparative Examples 5 to 7 were each produced in the same manner as in Example 1 except that mixed powder was produced by adding Bi in part by mole shown in Table 1 in terms of a metal to 100 parts by mole of a metal oxide represented by the general formula $(Ba_{1-x}Ca_x)_a(Ti_{1-y-z}Zr_yMn_z)O_3$. As in Example 1, the loading ratios of the raw materials agreed with an analysis value of the amount of Ca, an analysis value of the amount of Zr, and an analysis value of a ratio between the molar amount of Ba and Ca and the molar amount of Ti, Zr, and Mn in the metal oxide represented by the formula $(Ba_{1-x}Ca_x)_a(Ti_{1-y-z}Zr_yMn_z)O_3$ after the sintering in each of Examples 2 to 17 and Comparative Examples 1 to 7.

The evaluation results of the piezoelectric ceramics produced in Examples 1 to 17 and Comparative Examples 1 to 7 are shown in Table 1.

TABLE 1

| | 1 − x<br>Ba | x<br>Ca | 1 − y − z<br>Ti | y<br>Zr | z<br>Mn | Bi<br>(mol %) | a<br>A/B | Firing retention temperature (° C.) | Ratio of cross-sectional area of second region (%) |
|---|---|---|---|---|---|---|---|---|---|
| Comparative Example 1 | 0.813 | 0.187 | 0.940 | 0.060 | 0.00952 | | 0.9950 | 1,300 | ND |
| Example 1 | 0.813 | 0.187 | 0.940 | 0.060 | 0.00952 | | 0.9950 | 1,340 | 0.100 |
| Example 2 | 0.813 | 0.187 | 0.940 | 0.060 | 0.00952 | | 0.9950 | 1,360 | 0.070 |
| Example 3 | 0.813 | 0.187 | 0.940 | 0.060 | 0.00952 | | 0.9950 | 1,380 | 0.030 |
| Example 4 | 0.813 | 0.187 | 0.940 | 0.060 | 0.00952 | | 0.9950 | 1,400 | 0.010 |
| Comparative Example 2 | 0.813 | 0.187 | 0.940 | 0.060 | 0.00952 | | 0.9950 | 1,480 | 0.000 |
| Example 5 | 0.813 | 0.187 | 0.940 | 0.060 | 0.00952 | | 0.9920 | 1,320 | 0.010 |
| Example 6 | 0.813 | 0.187 | 0.940 | 0.060 | 0.00952 | | 0.9930 | 1,340 | 0.070 |
| Example 7 | 0.813 | 0.187 | 0.940 | 0.060 | 0.00952 | | 0.9970 | 1,420 | 0.010 |
| Comparative Example 3 | 0.813 | 0.187 | 0.940 | 0.060 | 0.00952 | | 1.0000 | 1,420 | ND |
| Example 8 | 0.840 | 0.160 | 0.940 | 0.060 | 0.00964 | | 0.9945 | 1,340 | 0.050 |
| Example 9 | 0.840 | 0.160 | 0.940 | 0.060 | 0.00964 | | 0.9945 | 1,360 | 0.035 |
| Example 10 | 0.840 | 0.160 | 0.940 | 0.060 | 0.00964 | | 0.9945 | 1,380 | 0.019 |
| Comparative Example 4 | 0.840 | 0.160 | 0.940 | 0.060 | 0.00964 | | 0.9945 | 1,400 | 0.000 |
| Example 11 | 0.860 | 0.140 | 0.930 | 0.070 | 0.00648 | 0.181 | 0.9925 | 1,340 | 0.045 |
| Example 12 | 0.860 | 0.140 | 0.930 | 0.070 | 0.00648 | 0.181 | 0.9925 | 1,360 | 0.031 |
| Example 13 | 0.860 | 0.140 | 0.930 | 0.070 | 0.00648 | 0.181 | 0.9925 | 1,380 | 0.020 |
| Comparative Example 5 | 0.860 | 0.140 | 0.930 | 0.070 | 0.00648 | 0.181 | 0.9925 | 1,400 | 0.000 |
| Comparative Example 6 | 0.860 | 0.140 | 0.930 | 0.070 | 0.00648 | 0.181 | 0.9945 | 1,320 | ND |
| Example 14 | 0.860 | 0.140 | 0.930 | 0.070 | 0.00648 | 0.181 | 0.9945 | 1,340 | 0.100 |
| Example 15 | 0.860 | 0.140 | 0.930 | 0.070 | 0.00648 | 0.181 | 0.9945 | 1,360 | 0.070 |

TABLE 1-continued

| | | | | | | | | |
|---|---|---|---|---|---|---|---|---|
| Example 16 | 0.860 | 0.140 | 0.930 | 0.070 | 0.00648 | 0.181 | 0.9945 | 1,380 | 0.035 |
| Example 17 | 0.860 | 0.140 | 0.930 | 0.070 | 0.00648 | 0.181 | 0.9945 | 1,400 | 0.010 |
| Comparative Example 7 | 0.860 | 0.140 | 0.930 | 0.070 | 0.00648 | 0.181 | 0.9945 | 1,420 | 0.000 |

| | Ratio of cross-sectional area of first region (%) | Curie temperature $T_C$ (° C.) | Piezoelectric constant $|d_{31}|$ (pm/V) | Average equivalent circular diameter (μm) | Relative density (%) | Absolute density (g/cm³) |
|---|---|---|---|---|---|---|
| Comparative Example 1 | — | — | — | — | 90.8 | 5.15 |
| Example 1 | 98.1 | 105 | 93 | 2.5 | 98.8 | 5.60 |
| Example 2 | 98.3 | 105 | 90 | 2.7 | 98.8 | 5.60 |
| Example 3 | 98.5 | 106 | 88 | 3.4 | 98.9 | 5.61 |
| Example 4 | 99.0 | 106 | 87 | 4.6 | 98.8 | 5.60 |
| Comparative Example 2 | 99.0 | 106 | 81 | 5.8 | 98.6 | 5.59 |
| Example 5 | 99.1 | 106 | 91 | 45.1 | 98.9 | 5.61 |
| Example 6 | 98.1 | 106 | 92 | 2.8 | 98.9 | 5.61 |
| Example 7 | 95.0 | 104 | 84 | 6.2 | 98.6 | 5.59 |
| Comparative Example 3 | — | — | — | — | 91.7 | 5.20 |
| Example 8 | 98.5 | 105 | 88 | 2.3 | 98.8 | 5.66 |
| Example 9 | 98.7 | 105 | 87 | 2.7 | 98.7 | 5.66 |
| Example 10 | 98.9 | 105 | 85 | 2.9 | 98.6 | 5.65 |
| Comparative Example 4 | 99.0 | 105 | 83 | 3.5 | 98.4 | 5.64 |
| Example 11 | 98.5 | 111 | 101 | 3.3 | 98.6 | 5.69 |
| Example 12 | 98.7 | 111 | 98 | 3.8 | 98.3 | 5.67 |
| Example 13 | 99.0 | 111 | 93 | 3.9 | 98.1 | 5.66 |
| Comparative Example 5 | 99.1 | 111 | 88 | 4.2 | 97.6 | 5.63 |
| Comparative Example 6 | — | — | — | — | 88.4 | 5.10 |
| Example 14 | 98.0 | 110 | 102 | 2.7 | 98.8 | 5.70 |
| Example 15 | 98.3 | 110 | 100 | 2.8 | 98.8 | 5.70 |
| Example 16 | 98.6 | 111 | 98 | 3.1 | 98.6 | 5.69 |
| Example 17 | 99.1 | 111 | 97 | 3.5 | 98.1 | 5.66 |
| Comparative Example 7 | 99.3 | 111 | 95 | 4.5 | 98.1 | 5.66 |

In addition, relationships between: the firing retention temperature; and the ratio of the cross-sectional area of the second region, the Curie temperature, and the piezoelectric constant in the cases of the piezoelectric ceramics of Examples and Comparative Examples of the present invention shown in Table 1 are shown in FIG. 6A to FIG. 6C, FIG. 7A to FIG. 7C, FIG. 8A to FIG. 8C, and FIG. 9A to FIG. 9C.

In each of Example 1 to Example 17, the presence of the second region 402 was able to be confirmed inside the first region, and the ratio of the cross-sectional area of the second region 402 was 0.1% or less.

Meanwhile, in each of Comparative Example 1 to Comparative Example 6, the second region 402 was not able to be confirmed. In Table 1, the "ND" represents a state in which the absolute density and the relative density of the piezoelectric ceramics after the sintering are small, and the sintering is insufficient.

As shown in Example 1 to Example 17, when the second region 402 is present inside the first region 401, a high piezoelectric constant is exhibited while a Curie temperature is maintained.

Comparison Between Examples 1 to 4 and Comparative Examples 1 and 2

The piezoelectric ceramics of Examples 1 to 4 and Comparative Examples 1 and 2 have the same composition ratios of the constituent elements as shown in Table 1. As shown in Table 1 and FIG. 6A to FIG. 6C, in each of the piezoelectric ceramics of Examples 1 to 4, which had been fired at a retention temperature of 1,400° C. or less, the ratio of the cross-sectional area of the second region 402 was from 0.010% to 0.100%. Meanwhile, in the piezoelectric ceramics of Comparative Example 2, which had been fired at a retention temperature of 1,480° C., the second region 402 was not generated inside the first region 401. Therefore, the following result was obtained: the piezoelectric ceramics of Examples 1 to 4 each had a higher absolute value $|d_{31}|$ of the piezoelectric constant by 7% or more than the piezoelectric ceramics of Comparative Example 2. In addition, each of the piezoelectric ceramics of Example 3 and Example 4, which had a ratio of the cross-sectional area of the second region 402 of 0.05% or less, was able to be increased in absolute value $|d_{31}|$ of the piezoelectric constant while maintaining a high Curie temperature. Meanwhile, in Comparative Example 1, in which the firing retention temperature was as low as 1,300° C., the relative density of the obtained piezoelectric ceramics was as small as 90.8%, which was smaller than 93%, the mechanical strength was small, and also the sintering was insufficient.

Comparison Between Example 4 and Example 5

The piezoelectric ceramics of Example 4 and Example 5 have the same values of X, Y, and Z in $(Ba_{1-x}Ca_x)_a$ $(Ti_{1-y-z}Zr_yMn_z)O_3$ as shown in Table 1. However, Example 4 differs from Example 5 in the following conditions: the value of "a" is 0.9950 and the firing retention temperature is 1,400° C. in Example 4, whereas the value of "a" is 0.9920 and the firing retention temperature is 1,320° C. in Example 5. In each of the piezoelectric ceramics of Example 4 and Example 5, the ratio of the cross-sectional area of the second region 402 was 0.010%, and the absolute value $|d_{31}|$ of the piezoelectric constant was able to be increased while a high Curie temperature was maintained. However, in the piezoelectric ceramics of Example 5, the average equivalent circular diameter was as large as 45.1 µm, which was larger than 10 µm, and hence the mechanical strength was lower than that of the piezoelectric ceramics of Example 4.

Comparison Between Example 4 and Example 7

The piezoelectric ceramics of Example 4 and Example 7 have the same values of X, Y, and Z in $(Ba_{1-x}Ca_x)_a(Ti_{1-y-z}Zr_yMn_z)O_3$ as shown in Table 1. However, Example 4 differs from Example 7 in the following conditions: the value of "a" is 0.9950 and the firing retention temperature is 1,400° C. in Example 4, whereas the value of "a" is 0.9970 and the firing retention temperature is 1,420° C. in Example 7. In each of the piezoelectric ceramics of Example 4 and Example 7, the ratio of the cross-sectional area of the second region 402 was 0.010%, and the absolute value $|d_{31}|$ of the piezoelectric constant was higher than that of the piezoelectric ceramics of Comparative Example 2, in which the second region 402 was not present inside the first region 401. However, in the piezoelectric ceramics of Example 7, the ratio of the cross-sectional area of the first region 401 was as small as 95.0%, which was smaller than 98%, and hence the Curie temperature was lowered by 2° C.

Comparison Between Example 2 and Example 6

The piezoelectric ceramics of Example 2 and Example 6 have the same values of X, Y, and Z in $(Ba_{1-x}Ca_x)_a(Ti_{1-y-z}Zr_yMn_z)O_3$ as shown in Table 1. However, Example 2 differs from Example 6 in the following conditions: the value of "a" is 0.9950 and the firing retention temperature is 1,360° C. in Example 2, whereas the value of "a" is 0.9930 and the firing retention temperature is 1,340° C. in Example 6. In each of the piezoelectric ceramics of Example 2 and Example 6, the ratio of the cross-sectional area of the second region 402 was 0.070%, and the absolute value $|d_{31}|$ of the piezoelectric constant was able to be increased while a high Curie temperature was maintained. In addition, when the value of "a" was small as in Example 6, the second region 402 was able to be formed inside the first region 401 of the piezoelectric ceramics even at a low firing retention temperature.

Comparative Example 3

In the piezoelectric ceramics of Comparative Example 3, the value of "a" was as large as 1.0000, and hence the relative density was as small as 91.7%, which was smaller than 93%, even when the firing retention temperature was set to 1,420° C., and the sintering was insufficient.

Comparison Between Examples 8 to 10 and Comparative Example 4

The piezoelectric ceramics of Examples 8 to 10 and Comparative Example 4 have the same composition ratios of the constituent elements as shown in Table 1. As shown in Table 1 and FIG. 7A to FIG. 7C, in each of the piezoelectric ceramics of Examples 8 to 10, which had been fired at a firing retention temperature of 1,380° C. or less, the ratio of the cross-sectional area of the second region 402 was from 0.019% to 0.050%. Meanwhile, in the piezoelectric ceramics of Comparative Example 4, which had been fired at a firing retention temperature of 1,400° C., the second region 402 was not generated inside the first region 401. Therefore, the following result was obtained: the piezoelectric ceramics of Examples 8 to 10 each had a higher absolute value $|d_{31}|$ of the piezoelectric constant by 2.5% or more than the piezoelectric ceramics of Comparative Example 4. In addition, the piezoelectric ceramics of Examples 8 to 10, which had a ratio of the cross-sectional area of the second region 402 of 0.05% or less, had the same Curie temperature, but the absolute value $|d_{31}|$ of the piezoelectric constant became higher as the ratio of the cross-sectional area of the second region 402 became larger.

Comparison Between Examples 11 to 13 and Comparative Example 5

The piezoelectric ceramics of Examples 11 to 13 and Comparative Example 5 have the same composition ratios of the constituent elements as shown in Table 1. As shown in Table 1 and FIG. 8A to FIG. 8C, in each of the piezoelectric ceramics of Examples 11 to 13, which had been fired at a firing retention temperature of 1,380° C. or less, the ratio of the cross-sectional area of the second region 402 was from 0.020% to 0.045%. Meanwhile, in the piezoelectric ceramics of Comparative Example 5, which had been fired at a firing retention temperature of 1,400° C., the second region 402 was not generated inside the first region. Therefore, the following result was obtained: the piezoelectric ceramics of Examples 11 to 13 each had a higher absolute value $|d_{31}|$ of the piezoelectric constant by 5.7% or more than the piezoelectric ceramics of Comparative Example 5. In addition, the piezoelectric ceramics of Examples 11 to 13 had the same Curie temperature, but the absolute value $|d_{31}|$ of the piezoelectric constant became higher as the ratio of the cross-sectional area of the second region 402 became larger.

Comparison Between Examples 14 to 17 and Comparative Examples 6 and 7

The piezoelectric ceramics of Examples 14 to 17 and Comparative Examples 6 and 7 have the same composition ratios of the constituent elements as shown in Table 1. As shown in Table 1 and FIG. 9A to FIG. 9C, in each of the piezoelectric ceramics of Examples 14 to 17, which had been fired at a firing retention temperature of 1,340° C. or more and 1,400° C. or less, the ratio of the cross-sectional area of the second region 402 was from 0.010% to 0.100%. Meanwhile, in the piezoelectric ceramics of Comparative Example 7, which had been fired at a firing retention temperature of 1,420° C. or more, the second region 402 was not generated inside the first region. Therefore, the following result was obtained: the piezoelectric ceramics of Examples 14 to 17 each had a higher absolute value $|d_{31}|$ of the piezoelectric constant by 2.1% or more than the piezoelectric ceramics of Comparative Example 7. In addition, each of the piezoelectric ceramics of Example 16 and Example 17, which had a ratio of the cross-sectional area of the second region 402 of 0.05% or less, was able to be increased in absolute value $|d_{31}|$ of the piezoelectric constant while maintaining a high Curie temperature. Meanwhile, in the piezoelectric ceramics of Comparative Example 6, in which the firing retention temperature was as low as 1,320° C., the relative density was as small as 88.4%, the mechanical strength was small, and also the sintering was insufficient.

The piezoelectric ceramics of the present invention exhibits high piezoelectricity while maintaining a Curie temperature. In addition, the piezoelectric ceramics of the present invention is free of lead, and hence has a small load on the environment. Accordingly, the piezoelectric ceramics of the present invention can be used without any problem even for a device using a great amount of piezoelectric ceramics, such as a piezoelectric element or an electronic apparatus including the piezoelectric element.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-110570, filed Jun. 8, 2018, which is hereby incorporated by reference herein in its entirety.

What is claimed is:

1. A piezoelectric ceramics comprising crystal grains including:
   a first region formed of a perovskite-type metal oxide having a crystal structure in which a central element of a unit cell is located at an asymmetrical position; and
   a second region formed of a perovskite-type metal oxide having a crystal structure in which a central element of a unit cell is located at a symmetrical position, and is present inside the first region,
   wherein the first region and the second region are present inside a same crystal grain, and
   wherein a ratio of a cross-sectional area of the second region to a cross-sectional area of the piezoelectric ceramics is 0.1% or less.

2. The piezoelectric ceramics according to claim 1, wherein a ratio of a cross-sectional area of the first region to the cross-sectional area of the piezoelectric ceramics is 99% or more.

3. The piezoelectric ceramics according to claim 1, wherein a peripheral portion of each of the crystal grains is occupied by the first region.

4. The piezoelectric ceramics according to claim 1, wherein the piezoelectric ceramics has a Curie temperature of 100° C. or more.

5. The piezoelectric ceramics according to claim 1, wherein the piezoelectric ceramics has an absolute value $|d_{31}|$ of a piezoelectric constant at 25° C. of 80 pm/V or more.

6. The piezoelectric ceramics according to claim 1, wherein the crystal grains have an average equivalent circular diameter of 1.0 μm to 10 μm.

7. The piezoelectric ceramics according to claim 1, wherein the piezoelectric ceramics has a relative density of 93% to 100%, where the relative density is bulk density of the piezoelectric ceramics divided by theoretical density of the piezoelectric ceramics×100.

8. The piezoelectric ceramics according to claim 1, wherein the second region has a cubic or $GdFeO_3$-type crystal structure.

9. The piezoelectric ceramics according to claim 8, wherein the crystal structure of the second region is represented by a space group Pnma.

10. The piezoelectric ceramics according to claim 1, wherein the crystal structure of the first region is represented by a space group P4mm.

11. The piezoelectric ceramics according to claim 1, wherein the metal oxide forming the second region comprises Ca and Ti.

12. The piezoelectric ceramics according to claim 1, wherein the metal oxide forming the first region comprises Ba and Ti.

13. The piezoelectric ceramics according to claim 1, wherein the metal oxide forming the second region comprises Ca and Ti, and
   wherein the metal oxide forming the first region comprises Ba and Ti.

14. The piezoelectric ceramics according to claim 13, wherein the piezoelectric ceramics has an absolute density of 5.5 g/cm$^3$ to 5.8 g/cm$^3$.

15. A piezoelectric element comprising:
   electrodes; and
   at least one piezoelectric ceramics portion,
   wherein a piezoelectric ceramics forming the at least one piezoelectric ceramics portion comprises the piezoelectric ceramics comprising crystal grains including:
   a first region formed of a perovskite-type metal oxide having a crystal structure in which a central element of a unit cell is located at an asymmetrical position; and
   a second region formed of a perovskite-type metal oxide having a crystal structure in which a central element of a unit cell is located at a symmetrical position, and is present inside the first region,
   wherein the first region and the second region are present inside a same crystal grain, and
   wherein a ratio of a cross-sectional area of the second region to a cross-sectional area of the piezoelectric ceramics is 0.1% or less.

16. The piezoelectric element according to claim 15, wherein the electrodes and the at least one piezoelectric ceramics portion are alternately stacked.

17. An electronic apparatus comprising the piezoelectric element of claim 15.

* * * * *